United States Patent
Segawa et al.

(10) Patent No.: US 9,066,439 B2
(45) Date of Patent: Jun. 23, 2015

(54) WIRING BOARD AND METHOD FOR MANUFACTURING THE SAME

(75) Inventors: Hiroshi Segawa, Ogaki (JP); Nobuyuki Naganuma, Ogaki (JP); Michimasa Takahashi, Ogaki (JP); Teruyuki Ishihara, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 87 days.

(21) Appl. No.: 13/483,587

(22) Filed: May 30, 2012

(65) Prior Publication Data

US 2013/0014982 A1 Jan. 17, 2013

Related U.S. Application Data

(60) Provisional application No. 61/507,644, filed on Jul. 14, 2011.

(51) Int. Cl.
| | |
|---|---|
| *H05K 1/16* | (2006.01) |
| *H05K 3/30* | (2006.01) |
| *H05K 3/36* | (2006.01) |
| *H05K 1/14* | (2006.01) |
| *H05K 3/34* | (2006.01) |

(52) U.S. Cl.
CPC ........... *H05K 1/141* (2013.01); *Y10T 29/49126* (2015.01); *H05K 1/142* (2013.01); *H05K 3/305* (2013.01); *H05K 3/368* (2013.01); *H05K 2201/09972* (2013.01); *H05K 2203/1189* (2013.01); *H05K 3/3452* (2013.01)

(58) Field of Classification Search
CPC ..... H05K 1/141; H05K 3/368; H05K 3/3452; H05K 2203/1189; H05K 2201/09972; H05K 3/305; H05K 3/28; H05K 2201/10674
See application file for complete search history.

(56) References Cited

U.S. PATENT DOCUMENTS

| | | | | |
|---|---|---|---|---|
| 5,165,984 | A * | 11/1992 | Schoenthaler | 428/209 |
| 6,687,985 | B2 * | 2/2004 | Sakamoto et al. | 29/830 |
| 6,784,375 | B2 * | 8/2004 | Miyake et al. | 174/261 |
| 7,145,231 | B2 * | 12/2006 | Hasebe et al. | 257/712 |
| 7,971,353 | B2 * | 7/2011 | Takayoshi et al. | 29/846 |
| 2008/0081161 | A1 * | 4/2008 | Tomita et al. | 428/209 |
| 2008/0235941 | A1 * | 10/2008 | Chow | 29/840 |
| 2009/0014205 | A1 * | 1/2009 | Kobayashi et al. | 174/255 |

FOREIGN PATENT DOCUMENTS

JP 11-317582 11/1999

* cited by examiner

*Primary Examiner* — Ishwarbhai B Patel
(74) *Attorney, Agent, or Firm* — Oblon, McClelland, Maier & Neustadt, L.L.P.

(57) ABSTRACT

A wiring board has a first wiring board having a first solder-resist layer, a second wiring board connected to the first wiring board and positioned in a first opening portion formed in the first solder-resist layer of the first wiring board, and a third wiring board connected to the first wiring board and positioned in a second opening portion formed in the first solder-resist layer of the first wiring board such that the second wiring board and the third wiring board are on the same side of the first wiring board. The first opening portion of the first wiring board and the second opening portion of the first wiring board form either a common opening portion accommodating the second and third wiring boards in the first solder-resist layer or separate opening portions separately accommodating the second wiring board and the third wiring board in the first solder-resist layer.

27 Claims, 25 Drawing Sheets

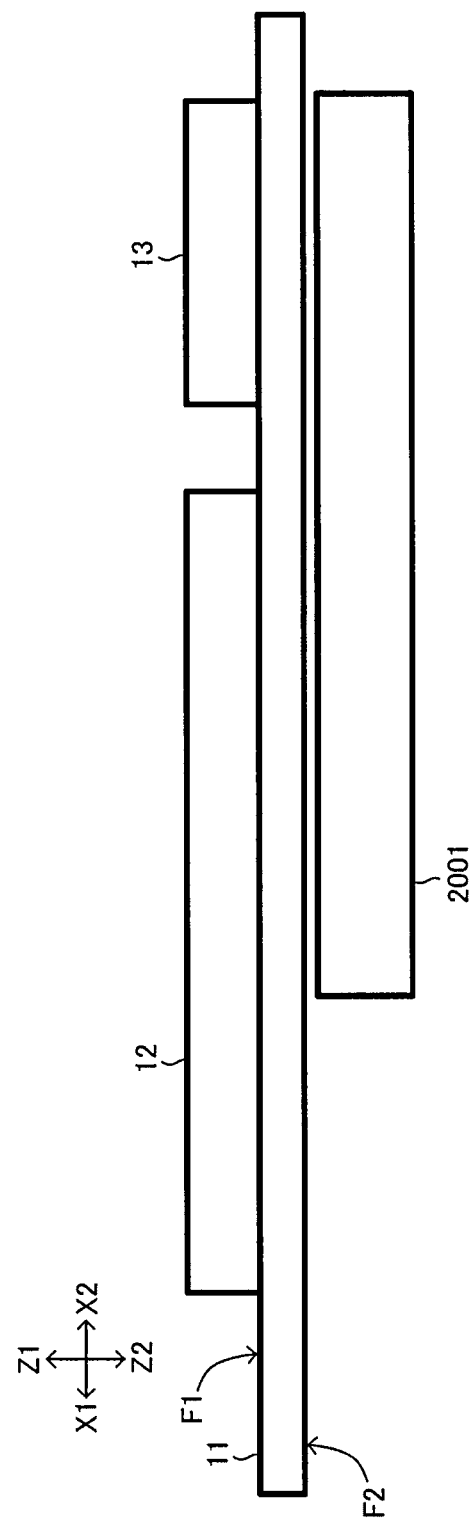

WIRING BOARD AND METHOD FOR MANUFACTURING THE SAME

CROSS-REFERENCE TO RELATED APPLICATIONS

The present application is based on and claims the benefit of priority to U.S. Application No. 61/507,644, filed Jul. 14, 2011, the entire contents of which are incorporated herein by reference.

BACKGROUND OF THE INVENTION

1. Field of the Invention

The present invention relates to a wiring board and its manufacturing method.

2. Discussion of the Background

Japanese Laid-Open Patent Publication No. H11-317582 describes a multilayer wiring board having a first wiring board and a second wiring board that has a greater number of conductive layers than the first wiring board, where the second wiring board (carrier board) is embedded in a recessed portion of the first wiring board (motherboard) so that part of such a multilayer wiring board is set to have a greater number of conductive layers than the rest. The contents of Japanese Laid-Open Patent Publication No. H11-317582 are incorporated herein by reference in this application.

SUMMARY OF THE INVENTION

According to one aspect of the present invention, a wiring board has a first wiring board having a first solder-resist layer, a second wiring board connected to the first wiring board and positioned in a first opening portion formed in the first solder-resist layer of the first wiring board, and a third wiring board connected to the first wiring board and positioned in a second opening portion formed in the first solder-resist layer of the first wiring board such that the second wiring board and the third wiring board are on the same side of the first wiring board. The first opening portion of the first wiring board and the second opening portion of the first wiring board form either a common opening portion accommodating the second wiring board and the third wiring board in the first solder-resist layer or separate opening portions separately accommodating the second wiring board and the third wiring board in the first solder-resist layer.

According to another aspect of the present invention, a method for manufacturing a wiring board includes preparing a first wiring board having a first solder-resist layer, forming a first opening portion in the first solder-resist layer of the first wiring board, forming a second opening portion in the first solder-resist layer of the first wiring board, positioning a second wiring board in the first opening portion in the first solder-resist layer of the first wiring board such that the second wiring board is connected to the first wiring board, and positioning a third wiring board in the second opening portion in the first solder-resist layer of the first wiring board such that the third wiring board is connected to the first wiring board and the second wiring board and the third wiring board are on a same side of the first wiring board. The first opening portion of the first wiring board and the second opening portion of the first wiring board form either a common opening portion accommodating the second wiring board and the third wiring board in the first solder-resist layer or separate opening portions separately accommodating the second wiring board and the third wiring board in the first solder-resist layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 10 is a view showing an example of usage of the wiring board according to the embodiment of the present invention;

DETAILED DESCRIPTION OF THE EMBODIMENTS

Figure 1:
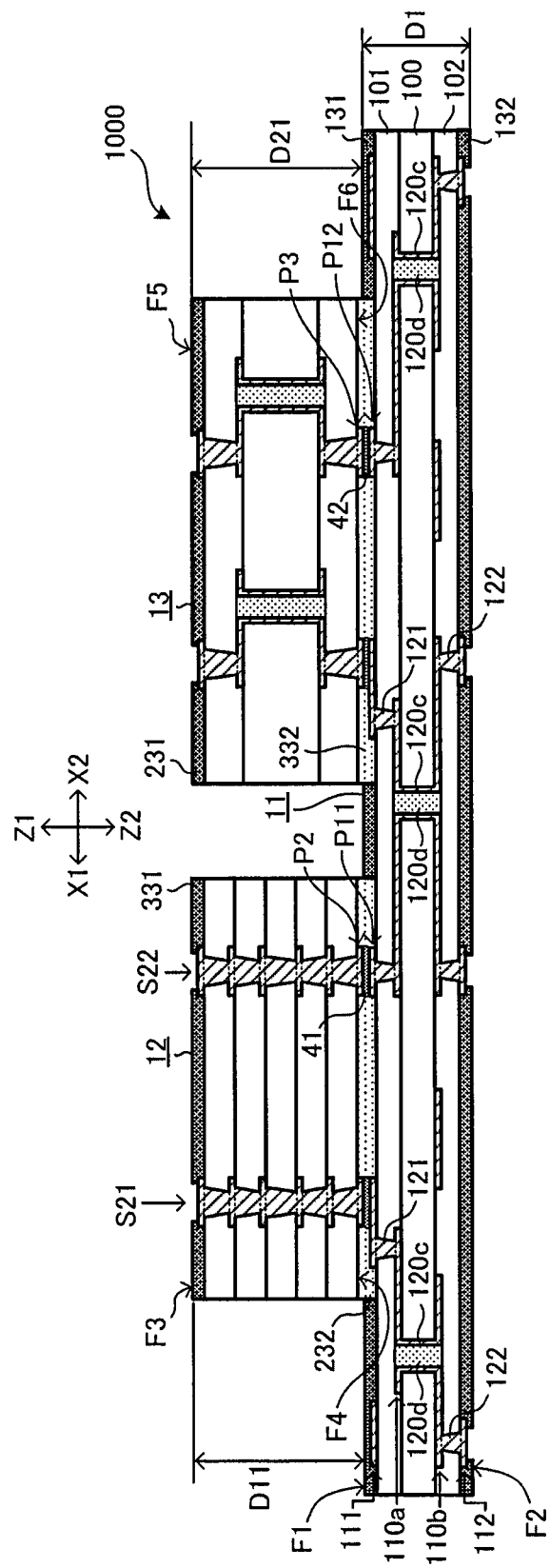
FIG. 1 is a cross-sectional view of a wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board (or a thickness direction of the wiring board) corresponding to a direction along a normal line to the main surfaces (upper and lower surfaces) of the wiring board. On the other hand, arrows (X1, X2) and (Y1, Y2) each indicate a direction perpendicular to a lamination direction (or a direction to a side of each layer). The main surfaces of the wiring board are on the X-Y plane. Side surfaces of the wiring board are on the X-Z plane or the Y-Z plane. Being directly on and directly under indicates a direction Z (Z1 side or Z2 side).

In the present embodiment, a side closer to a core (substrate 100, 200 or 300) is referred to as a lower layer, and a side farther from the core as an upper layer in a lamination direction.

Conductive layers are those formed with one or multiple conductive patterns. Conductive layers may include a conductive pattern to form an electrical circuit such as wiring (including ground), a pad, a land or the like; or it may include a planar conductive pattern or the like that does not form an electrical circuit.

Opening portions include cuts, slits and the like along with holes and grooves. Holes are not limited to penetrating holes, and include non-penetrating holes.

Among the conductors formed in opening portions, the conductive film formed on the inner surface (wall or bottom surface) of an opening portion is referred to as a conformal conductor, and the conductor filled in an opening portion is referred to as filled conductor. Also, the conductor formed in a via hole (wall or bottom surface) is referred to as a via conductor, and the conductor formed in a through hole (wall surface) is referred to as a through-hole conductor. A stacked-conductor structure means an assembly formed by stacking filled conductors in two or more layers.

Plating includes wet plating such as electrolytic plating as well as dry plating such as PVD (physical vapor deposition) and CVD (chemical vapor deposition).

Positioning a wiring board in an opening portion includes situations in which the entire wiring board is completely accommodated in an opening portion, and situations in which only one side of a wiring board (either end) is positioned in an opening portion.

Wiring board 1000 of the present embodiment has wiring board 11 (first wiring board), wiring board 12 (second wiring board) and wiring board 13 (third wiring board). Wiring boards (11~13) are each a multilayer printed wiring board. In the present embodiment, wiring boards (11~13) are each a rigid wiring board. In the following, one of the upper and lower surfaces (two main surfaces) of wiring board 11 (Z1 side) is referred to as first surface (F1), and the other (Z2 side) as second surface (F2). One of the upper and lower surfaces (two main surfaces) of wiring board 12 (Z1 side) is referred to as third surface (F3), and the other (Z2 side) as fourth surface (F4). In addition, one of the upper and lower surfaces (two main surfaces) of wiring board 13 (Z1 side) is referred to as fifth surface (F5), and the other (Z2 side) as sixth surface (F6).

As shown in FIG. 1, wiring board 11 has insulative substrate 100 (core substrate of wiring board 11), conductive layers (110*a*, 110*b*, 111, 112), insulation layers (101, 102), and solder-resist layers (131, 132). Wiring board 11 of the present embodiment has four conductive layers (110*a*, 110*b*, 111, 112).

On one side of substrate 100 (first-surface (F1) side), conductive layer (110*a*), insulation layer 101 and conductive layer 111 are laminated in that order, and via conductor 121 electrically connects between conductive layers (110*a*, 111). On the other side of substrate 100 (second-surface (F2) side), conductive layer (110*b*), insulation layer 102 and conductive layer 112 are laminated in that order, and via conductor 122 electrically connects between conductive layers (110*b*, 112).

Conductive layer (110a) and conductive layer (110b) are electrically connected to each other by through-hole conductor (120c).

A through hole is formed in substrate 100 and becomes through-hole conductor (120c) (conformal conductor) by forming copper-plated film, for example, on the wall surface of the through hole. Then, in the through hole, insulator (120d) is filled inside through-hole conductor (120c). Moreover, via holes are formed in insulation layers (101, 102) and respectively become via conductors (121, 122) (each a filled conductor) by filling each via hole with copper plating, for example.

Solder-resist layer 131 (first-surface side solder-resist layer) is formed on first surface (F1) of wiring board 11 (on insulation layer 101 and conductive layer 111), and solder-resist layer 132 is formed on second surface (F2) of wiring board 11 (on insulation layer 102 and conductive layer 112). Opening portions are formed in solder-resist layers (131, 132), and outermost conductive layers (conductive layers 111, 112) are exposed respectively in the opening portions to become pads (external connection terminals). Pad (P11) for connection with wiring board 12 and pad (P12) for connection with wiring board 13 are formed on first surface (F1) of wiring board 11. Pads (P11, P12) may be formed directly on via conductors, or they may be formed to avoid being positioned directly on via conductors.

Among wiring boards (11~13) in the present embodiment, wiring board 11 has the smallest thickness. In particular, in FIG. 1, thickness (D1) of wiring board 11 is 250 mm, for example, and thickness (D11) of wiring board 12 and thickness (D21) of wiring board 13 are each 450 mm, for example. Thickness (D11) of wiring board 12 and thickness (D21) of wiring board 13 are substantially the same in the present embodiment.

Figure 2:
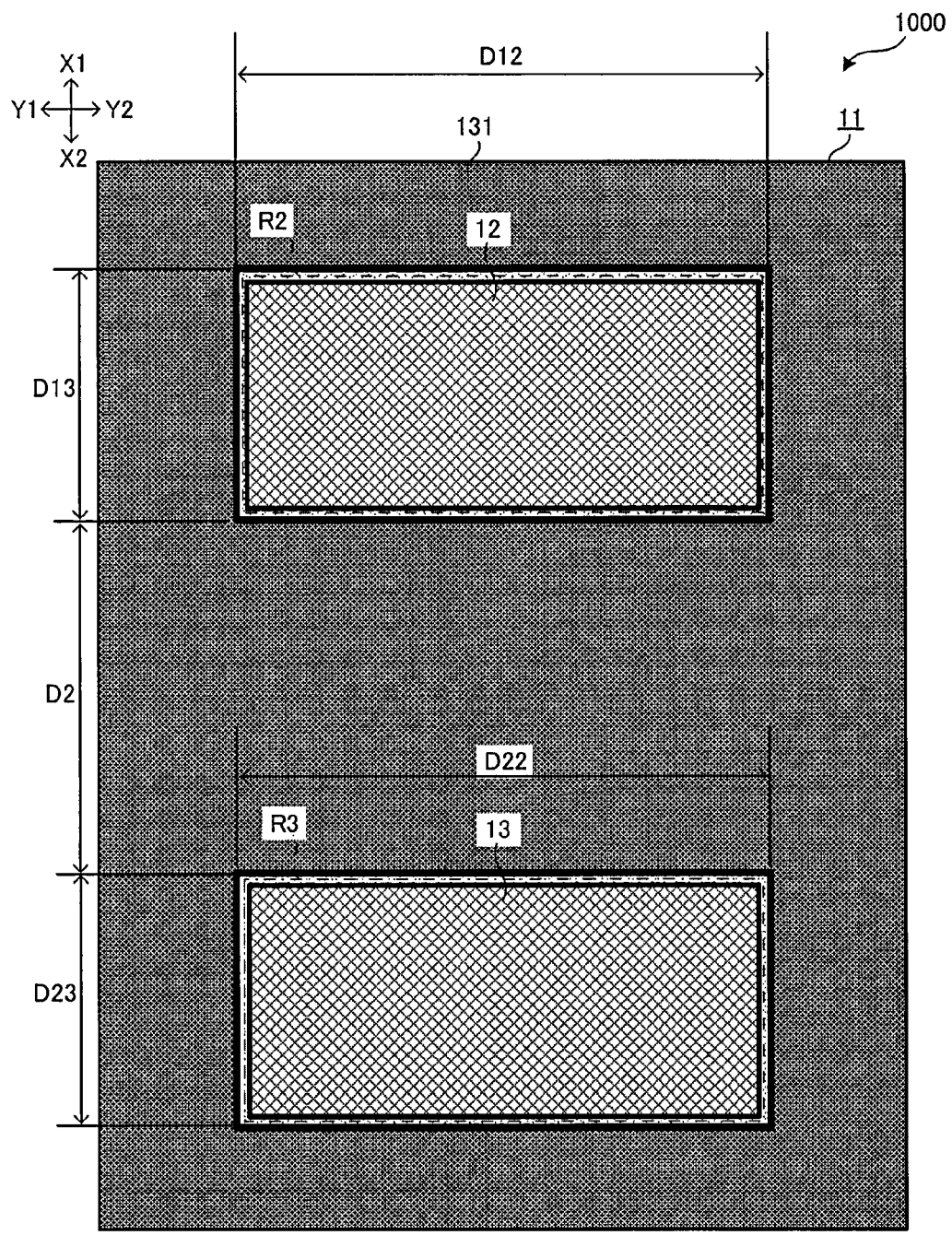
FIG. 2 is a plan view of the wiring board shown in FIG. 1.

Wiring boards (12, 13) are positioned on first surface (F1) of wiring board 11. In particular, as shown in FIG. 2, opening portions (R2, R3) are formed in solder-resist layer 131. The opening area of opening portion (R2) is greater than the bottom area of wiring board 12, and the opening area of opening portion (R3) is greater than the bottom area of wiring board 13. Wiring board 12 is positioned in opening portion (R2), and wiring board 13 is positioned in opening portion (R3).

In the present embodiment, opening portions (R2, R3) are respectively shaped to correspond to the outlines of wiring boards (12, 13) (for example, a similar shape with substantially the same size). The planar shapes (X-Y plane) of wiring boards (12, 13) and opening portions (R2, R3) are each substantially rectangular, for example. In FIG. 2, length (D12) of wiring board 12 (measurement in a longitudinal direction) is 40 mm, and width (D13) of wiring board 12 (measurement in a lateral direction) is 30 mm, for example. Also, length (D22) of wiring board 13 (measurement in a longitudinal direction) is 40 mm, for example, and width (D23) of wiring board 13 (measurement in a lateral direction) is 30 mm, for example. Space (distance D2) between wiring board 12 and wiring board 13 is 40 mm, for example. Opening portions (R2, R3) have a rectangular shape, and are greater than wiring boards (12, 13) respectively. The clearance (dimensional difference) of wiring board 12 and opening portion (R2) and the clearance (dimensional difference) of wiring board 13 and opening portion (R3) are each 500 µm, for example, in a longitudinal direction and 500 µm, for example, in a lateral direction. However, those are not the only options, and the shape and measurements of each wiring board and each opening portion may be determined freely.

Figure 3:
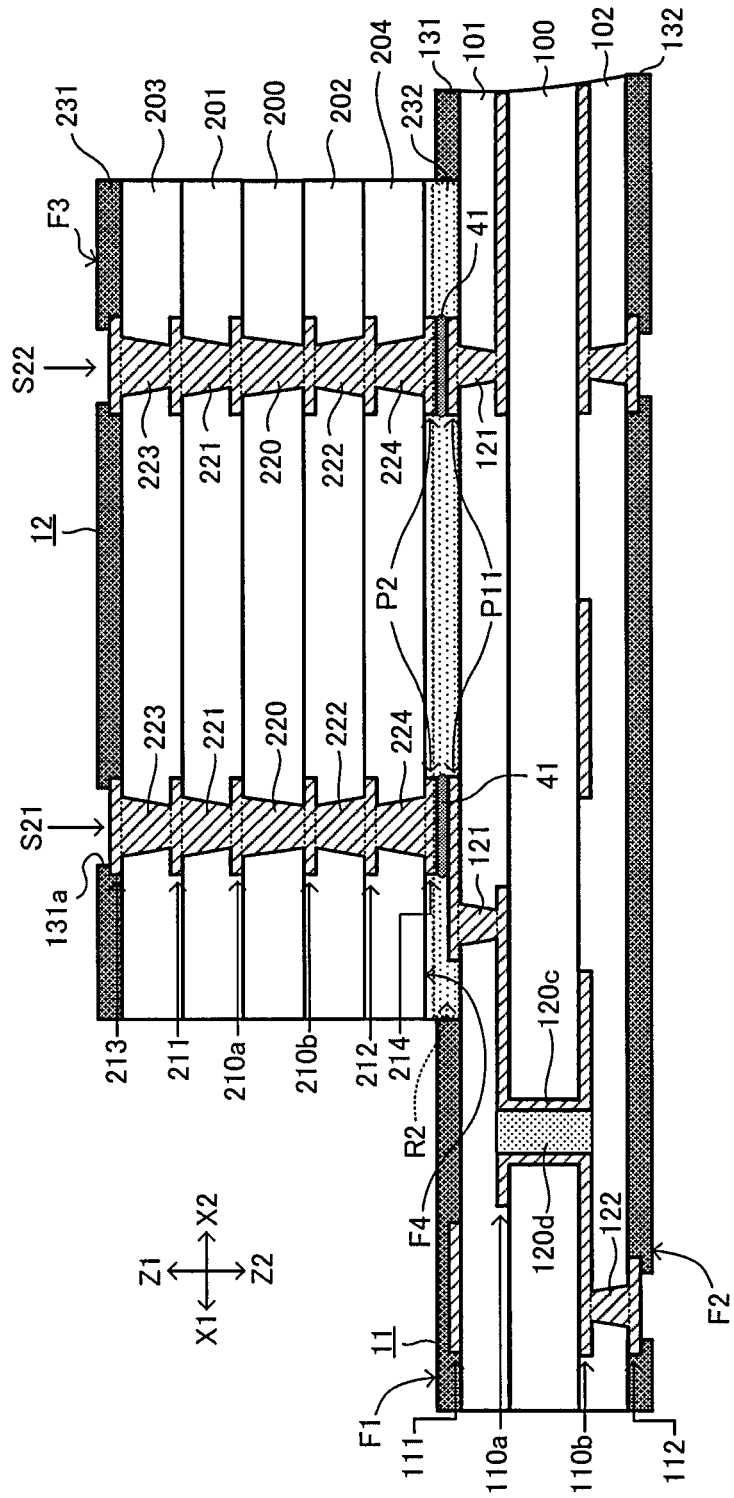
FIG. 3 is a cross-sectional view of the second wiring board shown in FIG. 1.
Figure 4:
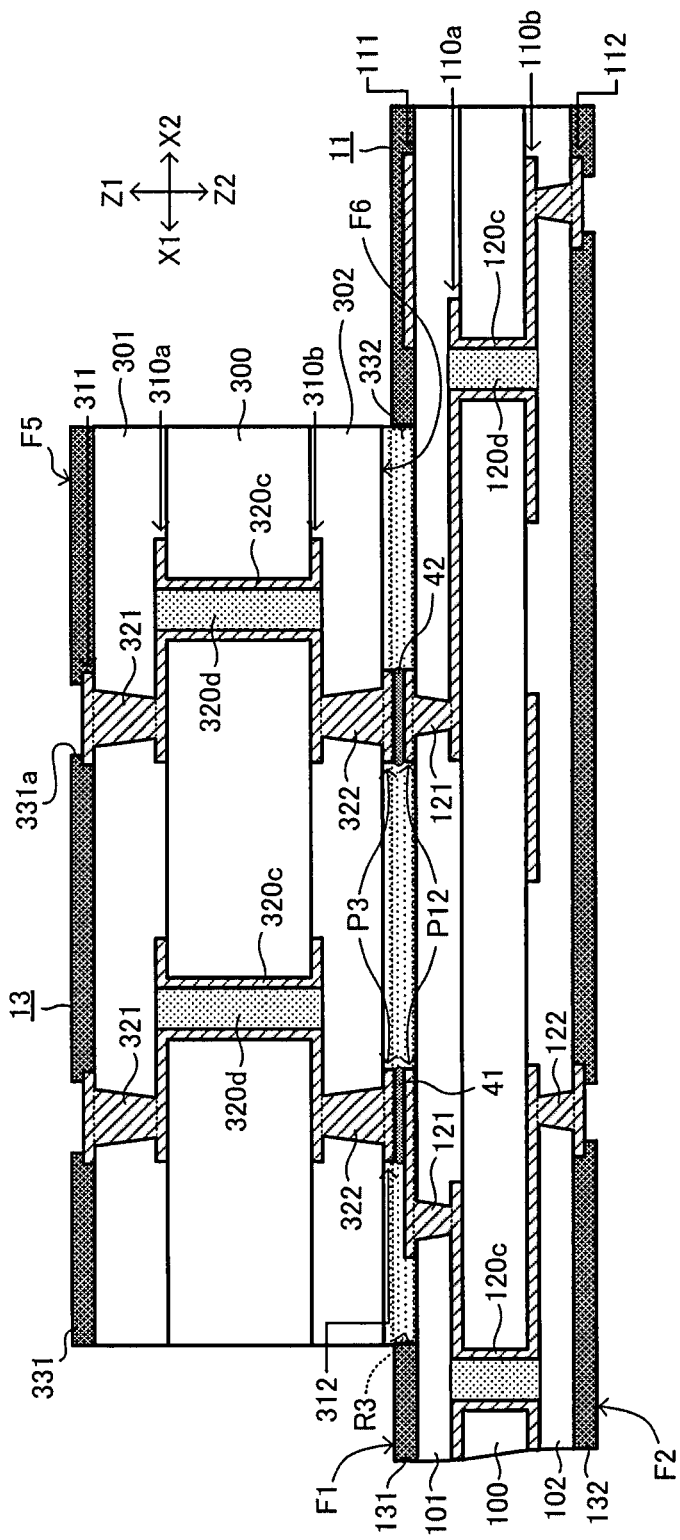
FIG. 4 is a cross-sectional view of the third wiring board shown in FIG. 1.

FIGS. 3 and 4 are views schematically showing wiring boards (12, 13).

As shown in FIG. 3, wiring board 12 has insulative substrate 200 (core substrate of wiring board 12), conductive layers (210a, 210b, 211~214), insulation layers (201~204) and solder-resist layer 231. Wiring board 12 of the present embodiment has six conductive layers (210a, 210b, 211, 212, 213, 214). Wiring board 12 has a filled conductor in every interlayer between conductive layers.

On one side of substrate 200 (third-surface (F3) side), conductive layer (210a), insulation layer 201, conductive layer 211, insulation layer 203 and conductive layer 213 are laminated in that order, and via conductors (221, 223) electrically connect each conductive layer. On the other side of substrate 200 (fourth-surface (F4) side), conductive layer (210b), insulation layer 202, conductive layer 212, insulation layer 204 and conductive layer 214 are laminated in that order, and via conductors (222, 224) electrically connect each conductive layer. Conductive layer (210a) and conductive layer (210b) are electrically connected to each other by via conductor 220.

A via hole is formed in substrate 200, and becomes via conductor 220 (filled conductor) by filling the via hole with copper plating, for example. In addition, via holes are formed respectively in insulation layers (201~204) and become via conductors (221~224) (each a filled conductor) by filling each via hole with copper plating, for example. In wiring board 12 of the present embodiment, via conductors (220~224) are stacked through all the layers to form multiple stacked-conductor structures "S" (vertical wiring portions). However, it is not always required for via conductors (220~224) to be stacked.

Solder-resist layer 231 is formed on third surface (F3) of wiring board 12 (on insulation layer 203 and conductive layer 213). An opening portion is formed in solder-resist layer 231, and the outermost conductive layer (conductive layer 213) is exposed through the opening portion to become a pad (external connection terminal). In addition, pad (P2) for connection with wiring board 11 is formed on fourth surface (F4) of wiring board 12.

As shown in FIG. 4, wiring board 13 has insulative substrate 300 (core substrate of wiring board 13), conductive layers (310a, 310b, 311, 312), insulation layers (301, 302) and solder-resist layer 331. Wiring board 13 of the present embodiment has four conductive layers (310a, 310b, 311, 312). Wiring board 13 has a filled conductor in every interlayer between conductive layers.

On one side of substrate 300 (fifth-surface (F5) side), conductive layer (310a), insulation layer 301 and conductive layer 311 are laminated in that order, and via conductor 321 electrically connects conductive layers (310a, 311). On the other side of substrate 300 (sixth-surface (F6) side), conductive layer (310b), insulation layer 302 and conductive layer 312 are laminated in that order, and via conductor 322 electrically connects conductive layers (310, 312). Conductive layer (310a) and conductive layer (310b) are electrically connected to each other by through-hole conductor (320c).

A through hole is formed in substrate 300 and becomes through-hole conductor (320c) (conformal conductor) by forming copper-plated film, for example, on the wall surface of the through hole. Then, in the through hole, insulator (320d) is filled inside through-hole conductor (320c). Moreover, via holes are formed in insulation layers (301, 302) and respectively become via conductors (321, 322) (each a filled conductor) by filling each via hole with copper plating, for example.

Solder-resist layer 331 is formed on fifth surface (F5) of wiring board 13 (on insulation layer 301 and conductive layer 311). An opening portion is formed in solder-resist layer 331, and the outermost conductive layer (conductive layer 311) is exposed through the opening portion to become a pad (external connection terminal). In addition, pad (P3) for connection with wiring board 13 is formed on sixth surface (F6) of wiring board 13.

Substrates (100, 200, 300) are each made of, for example, glass cloth (core material) impregnated with epoxy resin (hereinafter referred to as glass epoxy). The core material has a lower thermal expansion coefficient than the primary material (epoxy resin in the present embodiment). Preferred materials for the core material are inorganic materials, for example, glass fiber (such as glass cloth or glass non-woven fabric), aramid fiber (such as aramid non-woven fabric), silica filler or the like. However, basically, materials are freely selected for substrates (100, 200, 300). For example, polyester resin, bismaleimide triazine resin (BT resin), imide resin (polyimide), phenol resin, allyl polyphenylene ether resin (A-PPE resin) and the like may also be used instead of epoxy resin. Each substrate may be formed with multiple layers having different materials.

Insulation layers laminated on core substrates (substrates (100, 200, 300)) are each made of glass epoxy, for example. However, that is not the only option, and materials of insulation layers basically are determined freely. For example, polyester resin, bismaleimide triazine resin (BT resin), imide resin (polyimide), phenol resin, allyl polyphenylene ether resin (A-PPE resin) and the like may also be used instead of epoxy resin. Each insulation layer may be formed with multiple layers having different materials.

Conductive layers formed on the core substrates or on insulation layers laminated on the core substrates are each formed with copper foil (lower layer) and copper plating (upper layer), for example. Such conductive layers have wiring that forms electric circuits (wiring in a layer), lands, plain patterns to enhance the strength of wiring boards, or the like.

Through-hole conductors and via conductors that connect between conductive layers are each made of copper plating, for example. The shape of through-hole conductors is a column, for example, and the shape of via conductors is a tapered column (truncated cone), for example. A via conductor formed in a buildup section tapers with a diameter increasing from the core substrate toward its upper layer, for example. However, shapes of through-hole conductors and via conductors are not limited to the above, and may be determined freely.

Materials for each conductive layer, each via conductor and each through-hole conductor are selected freely as long as they are conductive, and they may be metallic or non-metallic. Each conductive layer, each via conductor and each through-hole conductor may be formed with multiple layers having different materials.

Each solder-resist layer is made of photosensitive resin using acrylic epoxy resin, for example. However, that is not the only option, and materials for each solder-resist layer may also be thermosetting resin mainly containing epoxy resin, UV-curable resin or the like.

In the present embodiment, the number of conductive layers in wiring board 12 (second wiring board) is different from the number of conductive layers in wiring board 13 (third wiring board) as shown in FIGS. 3 and 4. Wiring board 12 (see FIG. 3) has a greater number of conductive layers than wiring board 13 (see FIG. 4). Among wiring boards (11~13), the number of conductive layers is the smallest in wiring boards (11, 13).

Opening portions (R2, R3) (each a first-surface side opening portion) are formed in solder-resist layer 131 (the first-surface side solder-resist layer). The depths of opening portions (R2, R3) are each substantially the same as the thickness of solder-resist layer 131. Opening portions (R2, R3) penetrate through solder-resist layer 131 and reach the surface of insulation layer 101. However, that is not the only option, and the depths of opening portions (R2, R3) may be less than the thickness of solder-resist layer 131, or greater than the thickness of solder-resist layer 131 (see later-described FIGS. 24 and 25).

In the present embodiment, wiring boards (12, 13) are positioned in different opening portions (opening portions (R2, R3)), and are respectively connected to wiring board 11.

Specifically, in opening portion (R2), pad (P2) of wiring board 12 is electrically connected to pad (P11) of wiring board 11 through conductive bonding layer 41 as shown in FIG. 3. Adhesive layer 232 is formed between wiring board 11 and wiring board 12, and adhesive layer 232 is formed around bonding layer 41 in opening portion (R2).

Also, in opening portion (R3), pad (P3) of wiring board 13 is electrically connected to pad (P12) of wiring board 11 through conductive bonding layer 42 as shown in FIG. 4. Adhesive layer 332 is formed between wiring board 11 and wiring board 13, and adhesive layer 332 is formed around bonding layer 42 in opening portion (R3).

Figure 5A:
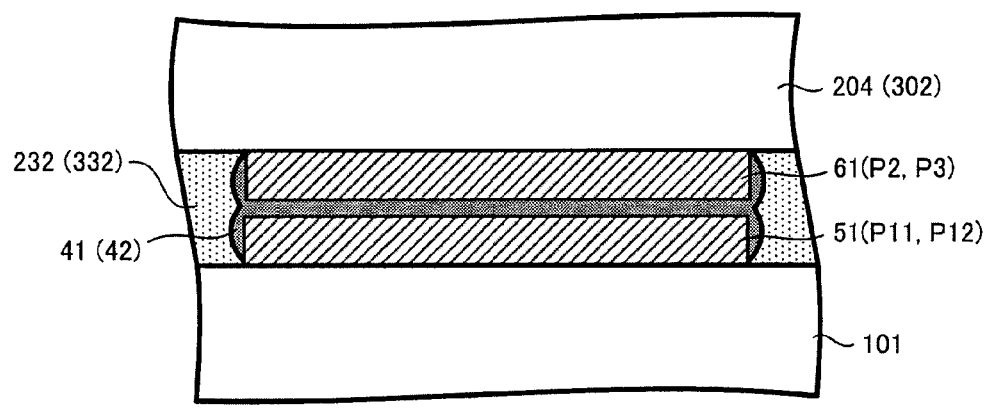
FIG. 5A is a cross-sectional view of a pad for the first wiring board, second wiring board and third wiring board shown in FIG. 1.

Pads (P11, P12) are each made of copper layer 51 as shown in FIG. 5A, for example. In addition, pads (P2, P3) are each made of copper layer 61. Since copper is an excellent conductor, it is suitable for wiring material.

Figure 5B:
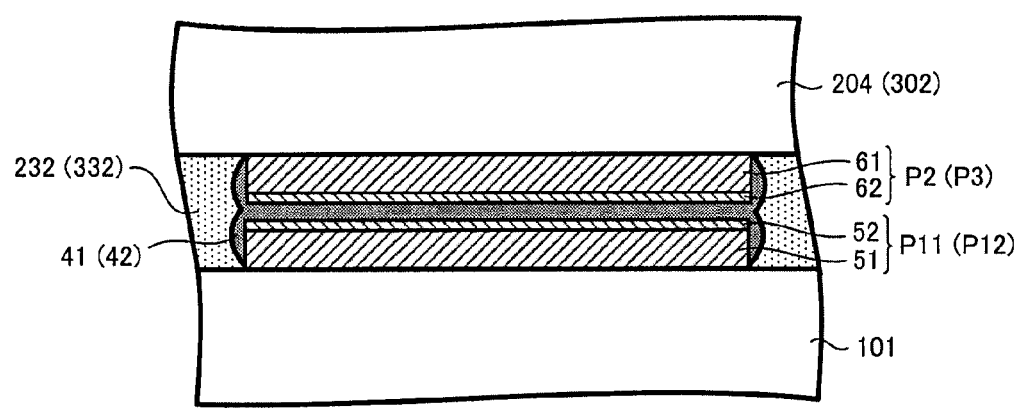
FIG. 5B is a cross-sectional view of another example of the pad for the first wiring board, second wiring board and third wiring board shown in FIG. 1.

However, that is not the only option. For example, as shown in FIG. 5B, cover layers (52, 62) may respectively be formed on copper layers (51, 61). Cover layers (52, 62) are each made of Ni (lower layer)-Au (upper layer), for example. By forming Ni—Au on the copper surface, corrosion is suppressed in the copper.

Bonding layers (41, 42) to connect between pads are made of solder (tin/lead alloy), for example. However, materials of bonding layers (41, 42) are not limited to such, and tin (Sn) may also be used instead of solder. Since tin shows excellent connectability, connection reliability of pads is enhanced by forming tin on pad surfaces. Bonding layers (41, 42) are preferred to be made of metallic material having a fusing point of 200~250° C. Using such metallic material, it is easier to fuse or cure by heating or cooling.

Pads (P11, P12) are each included in conductive layer 111, pad (P2) is included in conductive layer 214, and pad (P3) is included in conductive layer 312.

In wiring board 1000 of the present embodiment, since wiring boards (12, 13) having different numbers of layers are mounted on a surface (one surface) of wiring board 11, it is easier to connect wiring boards having different numbers of layers. As a result, design flexibility of wiring boards is enhanced.

In addition, since wiring boards (12, 13) are positioned in opening portions (R2, R3) (first-surface side opening portions) of solder-resist layer 131 (first-surface side solder-resist layer) formed on first surface (F1) of wiring board 11, the entire thickness of wiring board 1000 is made thinner. Also, by setting a thicker (higher) portion and a thinner (lower) portion in wiring board 11, and by positioning wiring boards (12, 13) in the thinner portion, wiring board 11 and wiring boards (12, 13) are positioned three-dimensionally. Furthermore, since wiring boards (12, 13) protrude less, it is easier to accommodate them in the casing of a mobile device.

Also, wiring boards are connected without using component connection technologies such as soldering, thus connection reliability is enhanced.

In the present embodiment, the depths of opening portions (R2, R3) are each substantially the same as the thickness of solder-resist layer 131. Such opening portions (R2, R3) are formed by exposure and development, for example. However, that is not the only option, and opening portions (R2, R3) may also be formed through etching or laser processing, for example.

In the present embodiment, opening portions (R2, R3) are respectively shaped corresponding to outlines of wiring boards (12, 13). Accordingly, it is easier to align wiring boards (12, 13).

In the present embodiment, thickness (D11) of wiring board 12 is substantially the same as thickness (D21) of wiring board 13. Here, thickness (D11) corresponds to the height from surface (F1) of wiring board 11 to third surface (F3) of wiring board 12, and thickness (D21) corresponds to the height from first surface (F1) of wiring board 11 to fifth surface (F5) of wiring board 13. Therefore, third surface (F3) of wiring board 12 (the surface opposite the surface facing first surface (F1)) has substantially the same height as fifth surface (F5) of wiring board 13 (the surface opposite the surface facing first surface (F1)). Accordingly, when wiring boards (12, 13) are simultaneously bonded to wiring board 11, it is easier to add uniform pressure on both of them. In the following, a method for manufacturing wiring board 1000 of the present embodiment is described.

Figure 6:
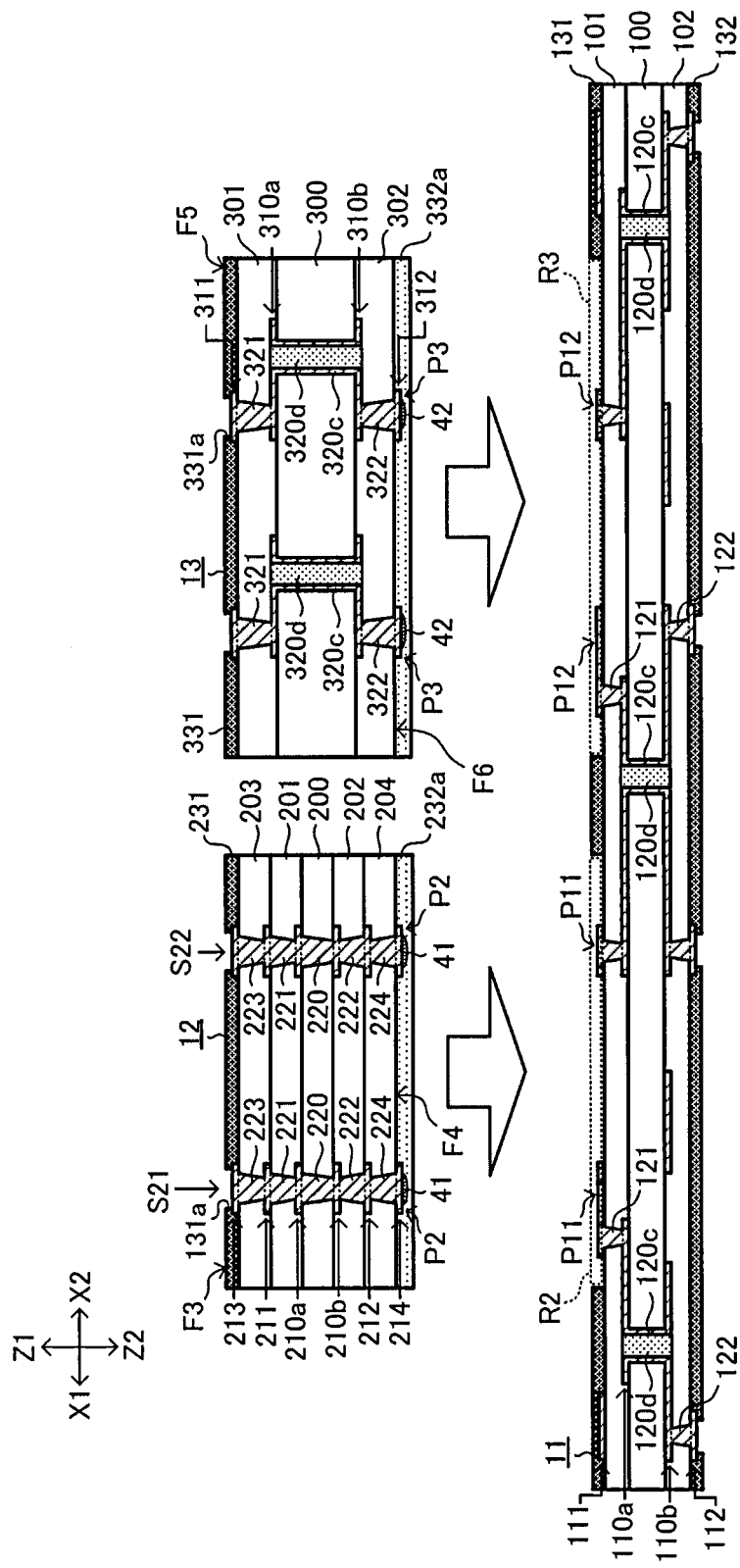
FIG. 6 is a view to illustrate a method for manufacturing a wiring board according to the embodiment of the present invention.

First, wiring boards (11~13) are prepared as shown in FIG. 6. In the present embodiment, the number of conductive layers in wiring board 12 is different from the number of conductive layers in wiring board 13, and wiring board 12 has a greater number of conductive layers than wiring board 13. Wiring boards (11, 13) have the smallest number of conductive layers among wiring boards (11~13).

Wiring boards (11~13) are each obtained as follows, for example: a double-sided copper-clad laminate is used as a starting material; an insulation layer and a conductive layer are alternately laminated, while conductive layers are connected by a via conductor; solder resist having an opening portion is formed on the outermost layer; and a cover layer is formed on a pad surface exposed through the opening portion.

Insulation layers are formed through vacuum lamination using thermosetting prepreg, for example. However, that is not the only option. For example, thermoplastic resin or RCF (resin-coated copper foil) may also be used, or pressing may be used for adhesion.

Conductive layers are formed by, for example, any of the following methods or any combination of two or more of them: panel plating, pattern plating, full-additive, semi-additive (SAP), subtractive and tenting methods.

Through-hole conductors (conformal conductors, for example) are formed, for example, by using a laser to form holes in a core substrate and by forming conductive film on wall surfaces of such holes through plating for forming conductive layers on the core substrate. Via conductors (filled conductors, for example) are formed, for example, by using a laser to form holes in insulation layers and by filling conductor in such holes through plating for forming conductive layers on insulation layers.

Solder-resist layers are formed by screen printing, spray coating, roll coating, lamination or the like, for example. Opening portions are formed in a solder-resist layer by exposure and development, for example. However, that is not the only option, and etching, laser processing or the like may also be employed to form opening portions.

Cover layers (52, 62) are formed by selective plating, for example.

Figure 7:
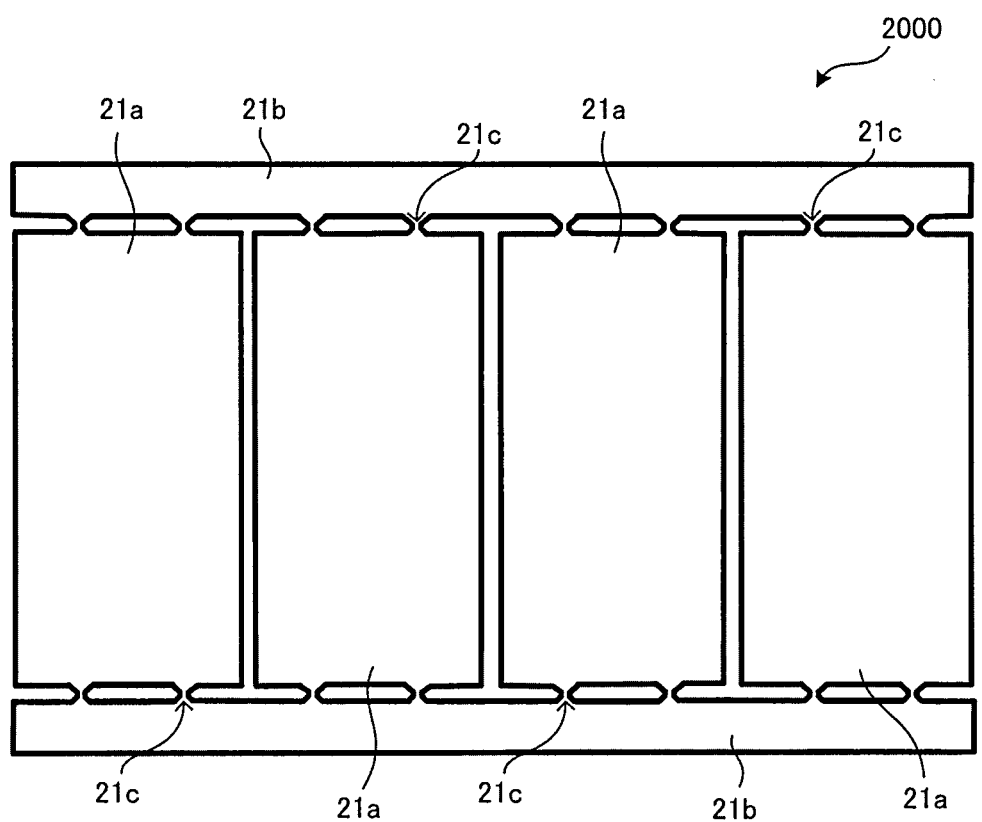
FIG. 7 is, in the method for manufacturing a wiring board according to the embodiment of the present invention, a view to illustrate a step for preparing a first wiring board, a second wiring board and a third wiring board.

Wiring boards (11~13) may each be obtained by separating a unit from an assembly of multiple wiring boards. For example, as shown in FIG. 7, panel 2000 (an assembly of multiple wiring boards) is prepared, which is formed with multiple wiring boards (21a) (any of wiring boards (11~13), for example), frame (21b) and bridges (21c). Then, a unit of wiring board (21a) is cut out by separating frame (21b) and wiring boards (21a) at bridges (21c). In panel 2000, multiple wiring boards (21a) are connected to common frame (21b) by bridges (21c) so that they are integrated. Frame (21b) and wiring boards (21a) are separated by cutting bridges (21c) using a router, for example.

Figure 8:
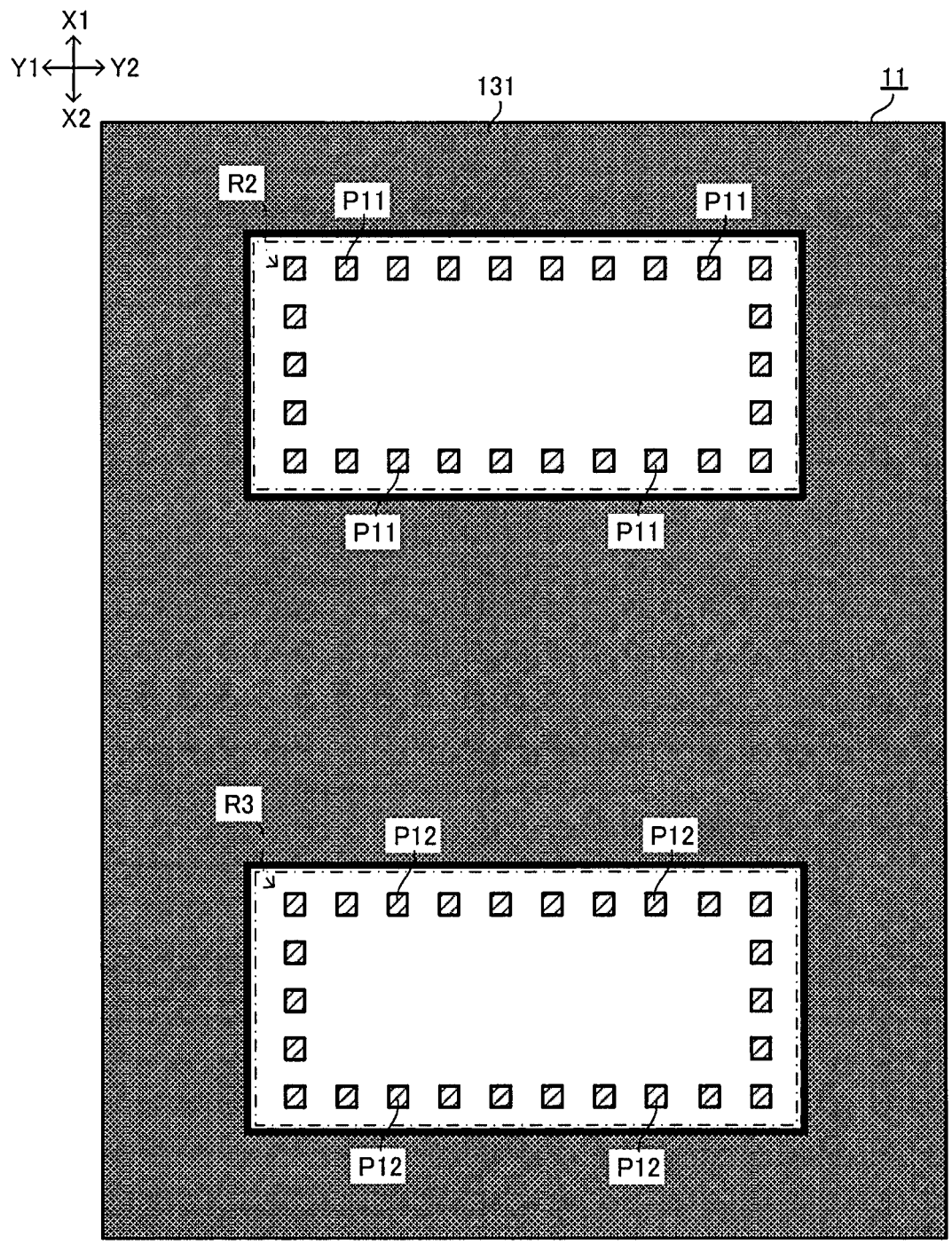
FIG. 8 is a plan view of the first wiring board shown in FIG. 7.

As shown in FIG. 8, wiring board 11 has solder-resist layer 131 on first surface (F1), and opening portions (R2, R3) are formed in solder-resist layer 131. Opening portions (R2, R3) are respectively shaped to correspond to outlines of wiring boards (12, 13) (such as a similar shape with substantially the same size). Pad (P11) is exposed in opening portion (R2), and pad (P12) is exposed in opening portion (R3). Pad (P2) (FIG. 6) is formed corresponding to pad (P11) on fourth surface (F4) of wiring board 12, and pad (P3) (FIG. 6) is formed corresponding to pad (P12) on sixth surface (F6) of wiring board 13.

Next, wiring board 12 is positioned in opening portion (R2), and fourth surface (F4) of wiring board 12 is connected to first surface (F1) of wiring board 11 in opening portion (R2). Also, wiring board 13 is positioned in opening portion (R3), and sixth surface (F6) of wiring board 13 is connected to first surface (F1) of wiring board 11 in opening portion (R3). In the present embodiment, connecting wiring board 12 and connecting wiring board 13 are conducted simultaneously.

Figure 9A:
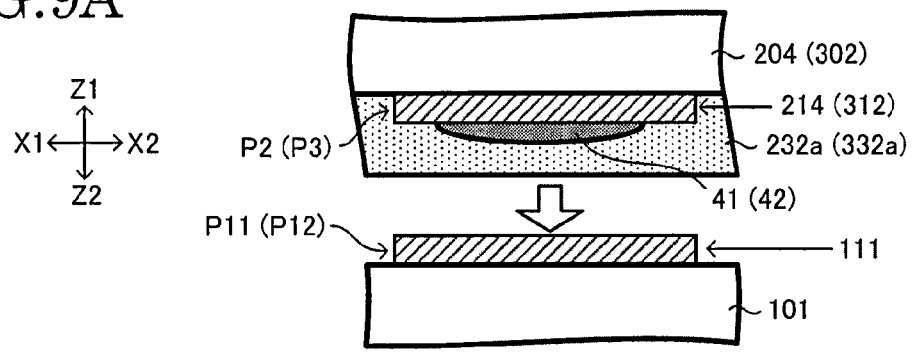
FIG. 9A is, in the method for manufacturing a wiring board according to the embodiment of the present invention, a view to illustrate a first step for connecting the first wiring board and the second wiring board or the third wiring board.

Specifically, as shown in FIGS. 6 and 9A, conductive bonding layer 41 is formed on pad (P2) of wiring board 12, and conductive bonding layer 42 is formed on pad (P3) of wiring board 13. Bonding layers (41, 42) are formed by printing or plating. Alternatively, sheet-type bonding layers (41, 42) may be laminated. Bonding layers (41, 42) are preferred to be made of metallic material with a fusing point of 200~250° C. Using such metallic material, it is easier to fuse or cure by heating or cooling.

Next, fluid adhesive agent (232a) is applied on insulation layer 204 (fourth surface (F4) of wiring board 12), and fluid adhesive agent (232a) is applied on insulation layer 302 (sixth surface (F6) of wiring board 13). Accordingly, pad (P2) and bonding layer 41 are covered by adhesive agent (232a), and pad (P3) and bonding layer 42 are covered by adhesive agent (232a). In the present embodiment, bonding layers (41, 42) are each made of thermosetting resin. However, that is not the only option, and thermoplastic resin may be used instead of thermosetting resin.

Figure 9B:
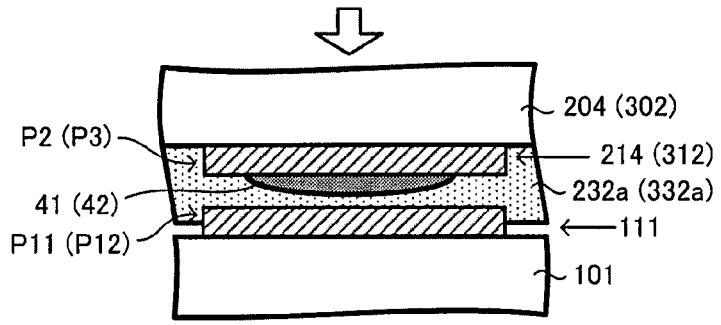
FIG. 9B is a view to illustrate a second step subsequent to the step in FIG. 9A.
Figure 9C:
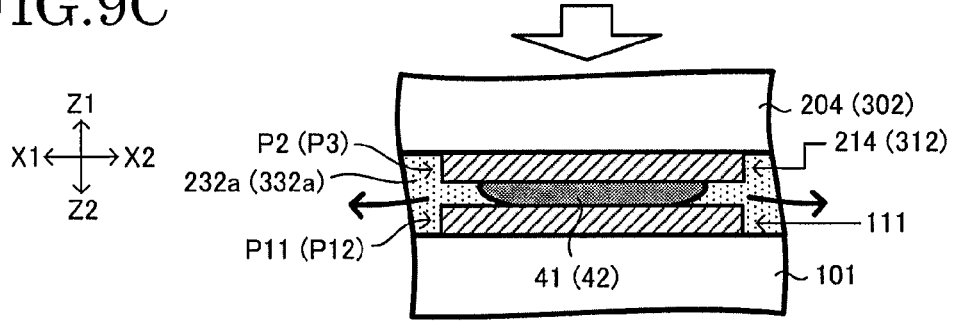
FIG. 9C is a view to illustrate a third step subsequent to the step in FIG. 9B.

Then, while keeping the above state, pad (P2) of wiring board 12 is set closer to pad (P11) of wiring board 11, and pad (P3) of wiring board 13 is set closer to pad (P12) of wiring board 11 as shown in FIG. 9B. Moreover, as shown in FIG. 9C, adhesive agents (232a, 332a) are sandwiched respectively between pad (P11) of wiring board 11 and pad (P2) of wiring board 12 and between pad (P12) of wiring board 11 and pad (P3) of wiring board 13, and wiring boards (12, 13) are each pressed toward wiring board 11 so that adhesive agents (232a, 332a) are compressed. In addition, wiring boards are heated while being pressed so that bonding layers (41, 42) are cured. In particular, wiring boards are heated at 180° C. for two hours, while being pressed at 60 kg/cm². Then, wiring boards are cooled at room temperature for an hour.

Figure 9D:
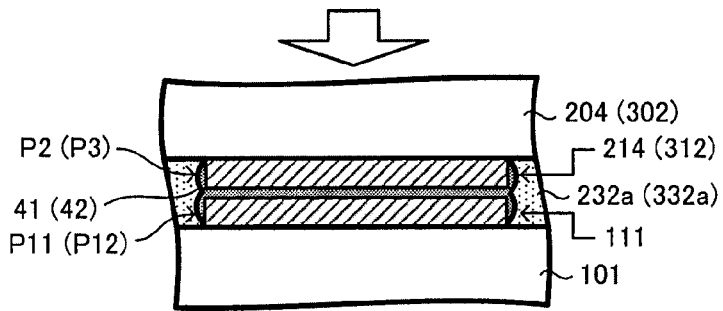
FIG. 9D is a view to illustrate a fourth step subsequent to the step in FIG. 9C.

As shown by an arrow in FIG. 9C, adhesive agents (232a, 332a) are pushed out in direction X or direction Y by the above pressing. Force is further added to compress bonding layers (41, 42) as shown in FIG. 9D. By doing so, metallic particles in bonding layers (41, 42) are condensed, enhancing conductivity. As a result, in opening portion (R2), pad (P2) of wiring board 12 is electrically connected to pad (P11) of wiring board 11 through bonding layer 41, and in opening portion (R3), pad (P3) of wiring board 13 is electrically connected to pad (P12) of wiring board 11 through bonding layer 42. Adhesive layer 232 is formed around bonding layer 41 in opening portion (R2), and adhesive layer 332 is formed around bonding layer 42 in opening portion (R3).

In the present embodiment, third surface (F3) of wiring board 12 and fifth surface (F5) of wiring board 13 are set at substantially the same height. Therefore, it is easier to uniformly add pressure on wiring boards (12, 13) in the above pressing. As a result, connection reliability tends to be enhanced between wiring board 11 and wiring boards (12, 13).

Through the above connection procedure, wiring board 12 is positioned in opening portion (R2) and wiring board 13 is positioned in opening portion (R3).

Wiring board 1000 of the present embodiment (FIG. 1) is completed through the above procedures. Wiring board 1000 is used as a circuit board for cell phones or other mobile equipment. For example, as shown in FIG. 10, when battery 2001 is mounted in a casing of a compact device (such as mobile devices) along with wiring board 1000 of the present embodiment, it is easier to increase the size of battery 2001 since battery 2001 can be positioned on the second-surface (F2) side of wiring board 1000. In addition, as for the specific usage of wiring boards (12, 13) mounted on wiring board 11, it is an option to use wiring board 12 having a greater number of conductive layers as a main circuit, and wiring board 13 having a lower number of conductive layers as a sub-circuit.

The manufacturing method according to the present embodiment is suitable for manufacturing wiring board 1000. Using such a manufacturing method, excellent wiring boards 1000 are obtained at low cost.

The present invention is not limited to the above embodiment. For example, the present invention may be carried out by being modified as follows.

Other wiring boards, electronic components and the like may be mounted on second surface (F2) of wiring board 1000.

Figure 11:
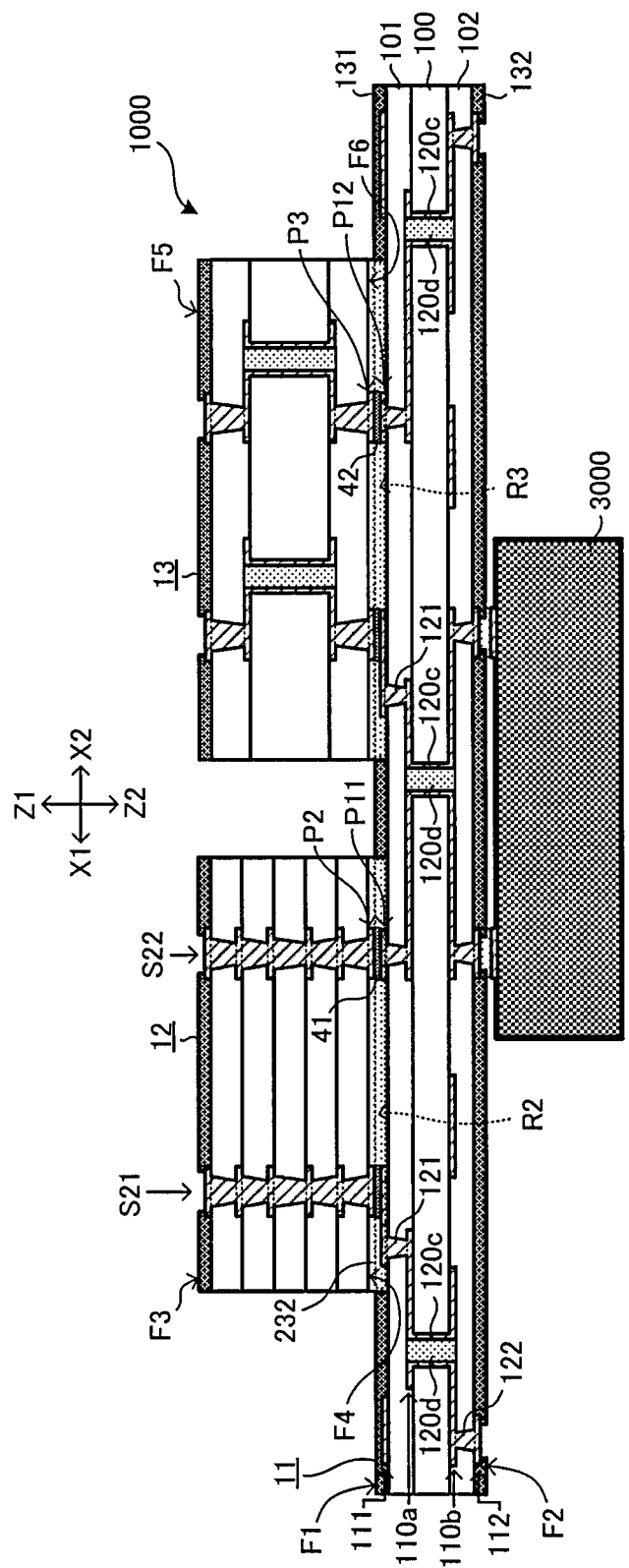
FIG. 11 is, in another embodiment of the present invention, a view showing an example where an electronic component is surface mounted on a wiring board.

For example, as shown in FIG. 11, electronic component 3000 may be mounted on second surface (F2) of wiring board 1000. Electronic component 3000 is not limited to any specific type. For example, any type of electronic component, for example, active components such as an IC circuit, as well as passive components such as a capacitor, resistor or inductor, may be selected.

Figure 12:
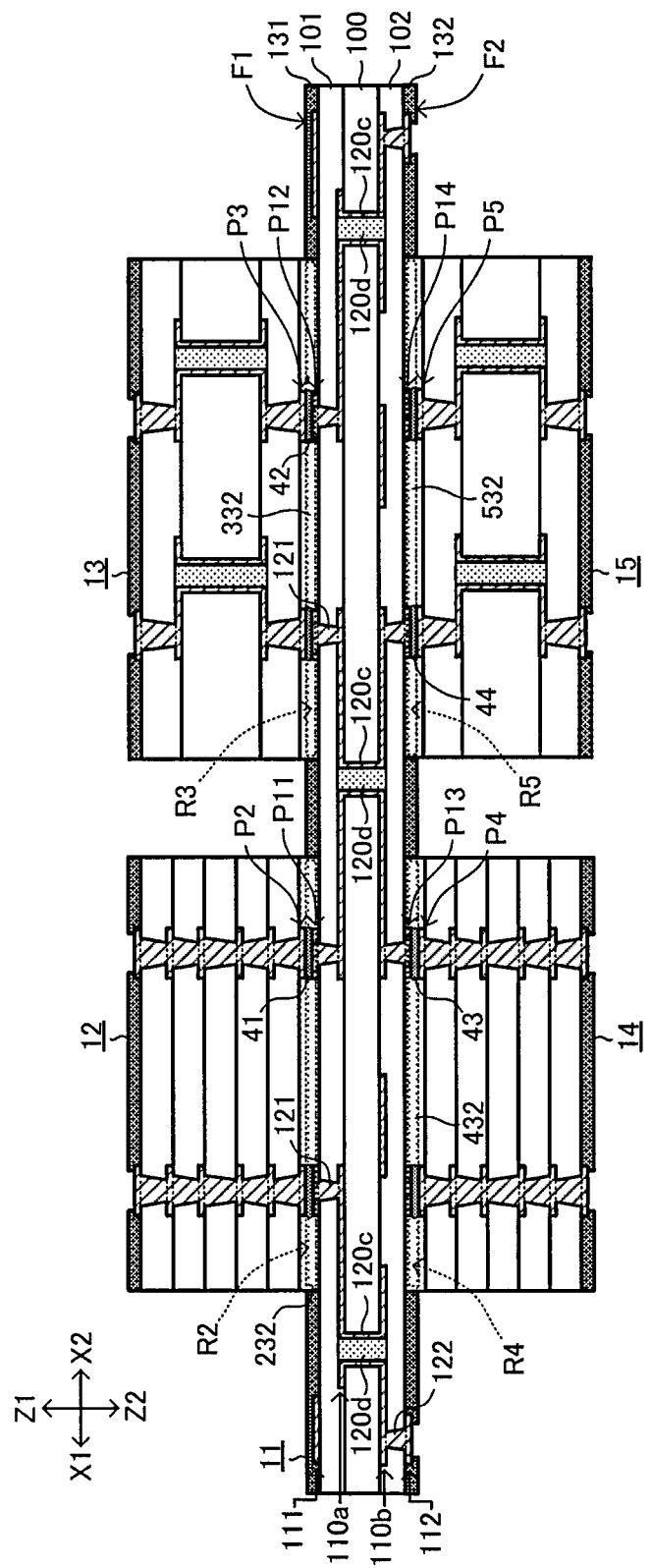
FIG. 12 is, in yet another embodiment of the present invention, a view showing an example where wiring boards are mounted on both surfaces of a first wiring board.

As shown in FIG. 12, wiring boards may be mounted on both surfaces of wiring board 11 (first wiring board).

In the example shown in FIG. 12, wiring board 11 (first wiring board) has solder-resist layer 132 (second-surface side solder-resist layer) on second surface (F2), and opening portions (R4, R5) (each a second-surface side opening portion) are formed in solder-resist layer 132. Then, another wiring board 14 positioned in opening portion (R4) and yet another wiring board 15 positioned in opening portion (R5) are each connected to second surface (F2) of wiring board 11. In opening portion (R4), pad (P11) of wiring board 11 and pad (P4) of wiring board 14 are electrically connected through bonding layer 43, and adhesive layer 432 is formed around bonding layer 43. In opening portion (R5), pad (P14) of wiring board 11 and pad (P5) of wiring board 15 are electrically connected through bonding layer 44, and adhesive layer 532 is formed around bonding layer 44. Wiring board 14 has the same structure as wiring board 12, for example, and wiring board 15 has the same structure as wiring board 13, for example. However, the structures of other wiring boards (14, 15) are not limited to such, and any other structures may also be employed.

Figure 13:
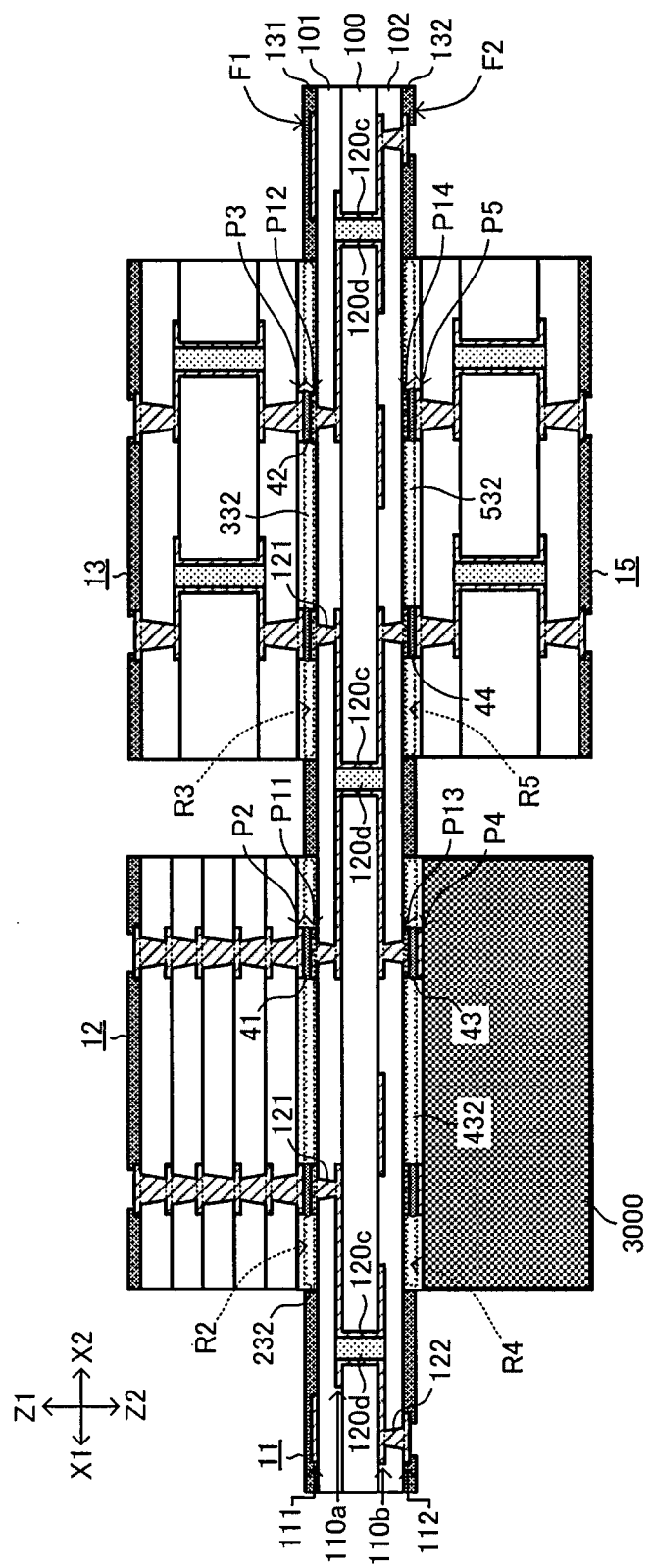
FIG. 13 is, regarding the example shown in FIG. 12, a view showing an alternative example where a wiring board is replaced with an electronic component, for example.

As shown in FIG. 13, instead of wiring board 14 in the example shown in FIG. 12, electronic component 3000 may be positioned in opening portion (R4) and connected to second surface (F2) of wiring board 11.

In the example shown in FIG. 12, either wiring board 14 or 15 may be omitted. In addition, in the example shown in FIG. 13, either electronic component 3000 or wiring board 15 may be omitted.

Figure 14:
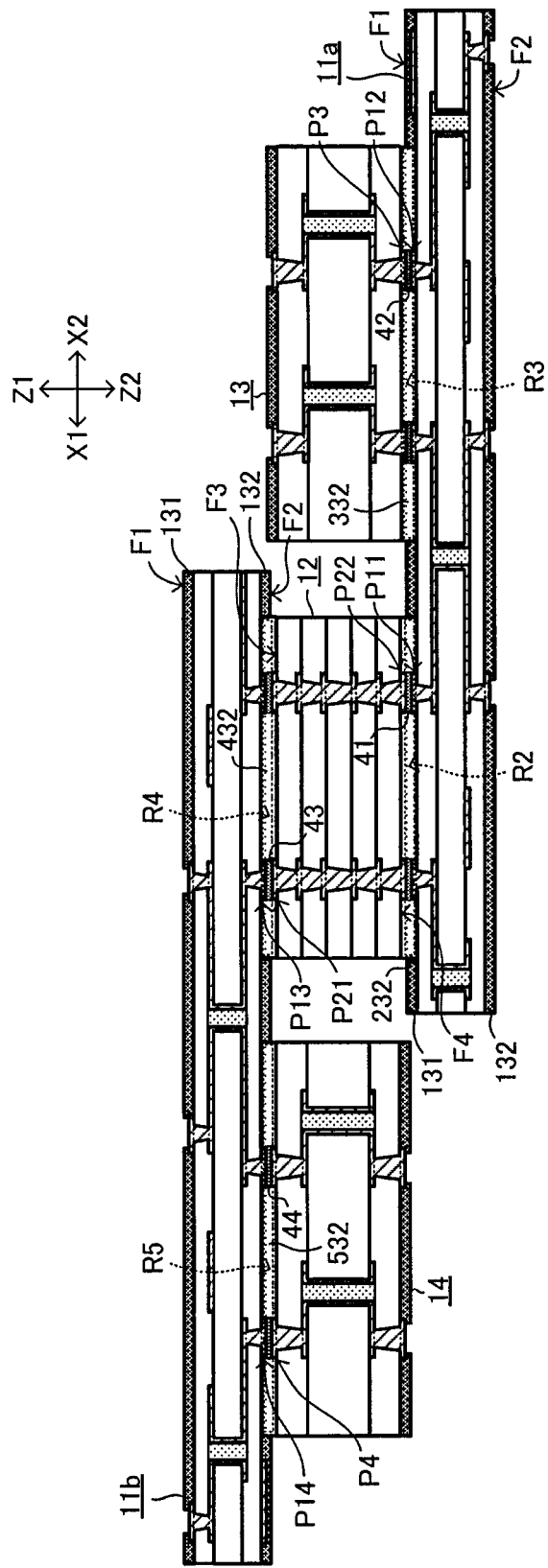
FIG. 14 is, in yet another embodiment of the present invention, a view showing an example where either a second wiring board or a third wiring board is mounted on and shared by multiple first wiring boards.

As shown in FIG. 14, one wiring board (wiring board 12, for example) may be mounted on and shared by two wiring boards (11a, 11b), which are structured substantially the same as wiring board 11 shown in FIG. 11. In the example shown in FIG. 14, one side of wiring board 12 (fourth-surface (F4) side) is positioned in opening portion (R2) formed in solder-resist layer 131 of wiring board (11a), and the other side of wiring board 12 (third-surface (F3) side) is positioned in opening portion (R4) formed in solder-resist layer 132 of wiring board (11b).

Specifically, wiring board (11a) (first wiring board) has first surface (F1), second surface (F2) opposite first surface (F1), and solder-resist layer 131 (first-surface side solder-resist layer) formed on first surface (F1). Opening portions (R2, R3) (each a first-surface side opening portion) are formed in solder-resist layer 131 of wiring board (11a), and wiring board 12 (second wiring board) positioned in opening portion (R2) and wiring board 13 (third wiring board) positioned in opening portion (R3) are each connected to first surface (F1) of wiring board (11a). Here, in opening portion (R2), pad (P11) of wiring board (11a) and pad (P22) on the fourth-surface (F4) side of wiring board 12 are electrically connected through bonding layer 41, and adhesive layer 232 is formed around bonding layer 41. In opening portion (R3), pad (P12) of wiring board (11a) and pad (P3) of wiring board 13 are electrically connected through bonding layer 42, and adhesive layer 332 is formed around bonding layer 42.

Also, wiring board (11b) (fourth wiring board) has first surface (F1), second surface (F2) opposite first surface (F1), and solder-resist layer 132 (second-surface side solder-resist layer) formed on second surface (F2). Opening portions (R4, R5) (each a second-surface side opening portion) are formed in solder-resist layer 132 of wiring board (11b), and wiring board 12 (second wiring board) positioned in opening portion (R4) and wiring board 14 positioned in opening portion (R5) are each connected to second surface (F2) of wiring board (11b). Here, in opening portion (R4), pad (P11) of wiring board (11b) and pad (P21) on the third-surface (F3) side of wiring board 12 are electrically connected through bonding layer 43, and adhesive layer 432 is formed around bonding layer 43. In opening portion (R5), pad (P14) of wiring board (11b) and pad (P4) of wiring board 14 are electrically connected through bonding layer 44, and adhesive layer 532 is formed around bonding layer 44.

Wiring board 12 is sandwiched by wiring boards (11a, 11b) in the example shown in FIG. 14.

Figure 15:
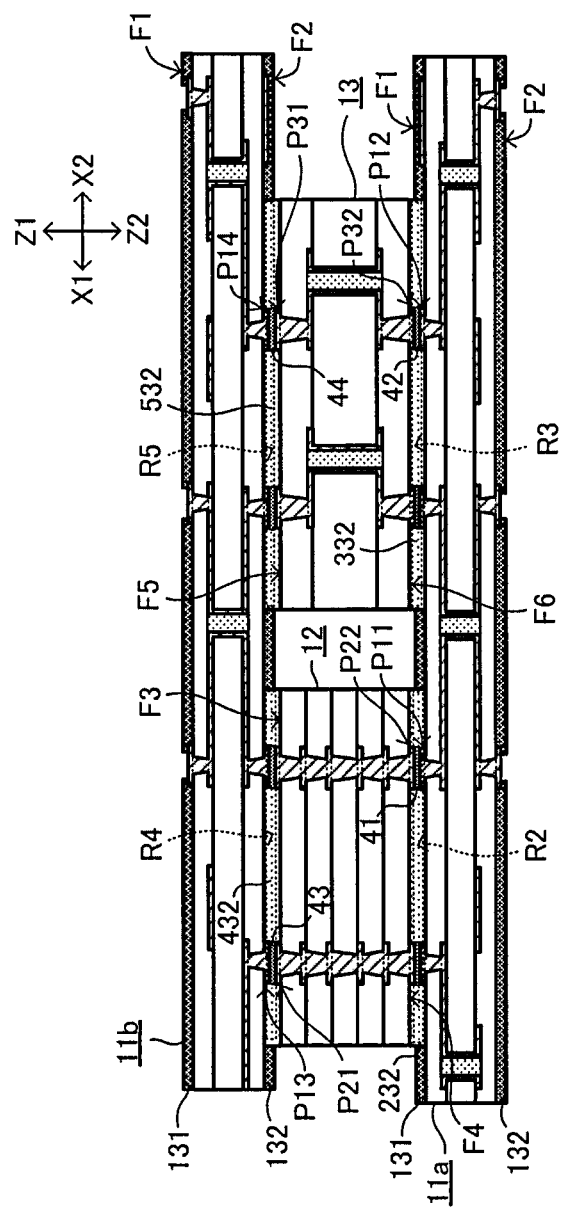
FIG. 15 is, in yet another embodiment of the present invention, a view showing an example where both a second wiring board and a third wiring board are mounted on and shared by multiple first wiring boards.

As shown in FIG. 15, multiple wiring boards (wiring boards (12, 13), for example) may be mounted on and shared by two wiring boards (11a, 11b), which are structured substantially the same as wiring board 11 shown in FIG. 1. In the example shown in FIG. 15, wiring board 12 (second wiring board) is mounted on wiring boards (11a, 11b) the same as in the example in FIG. 14, while wiring board 13 (third wiring board) is also mounted on wiring boards (11a, 11b). Specifically, opening portion (R3) is formed in solder-resist layer 131 of wiring board (11a), and opening portion (R5) is formed in solder-resist layer 132 of wiring board (11b). One side of wiring board 13 is positioned in opening portion (R3) of wiring board (11a). In opening portion (R3), pad (P12) of wiring board (11a) and pad (P32) on the sixth-surface (F6) side of wiring board 13 are electrically connected through bonding layer 42. Also, the other side of wiring board 13 is positioned in opening portion (R5) of wiring board (11b). In opening portion (R5), pad (P14) of wiring board (11b) and pad (P31) on the fifth-surface (F5) side of wiring board 13 are electrically connected through bonding layer 44.

In the example shown in FIG. 15, wiring boards (12, 13) are each sandwiched by wiring boards (11a, 11b).

Figure 16:
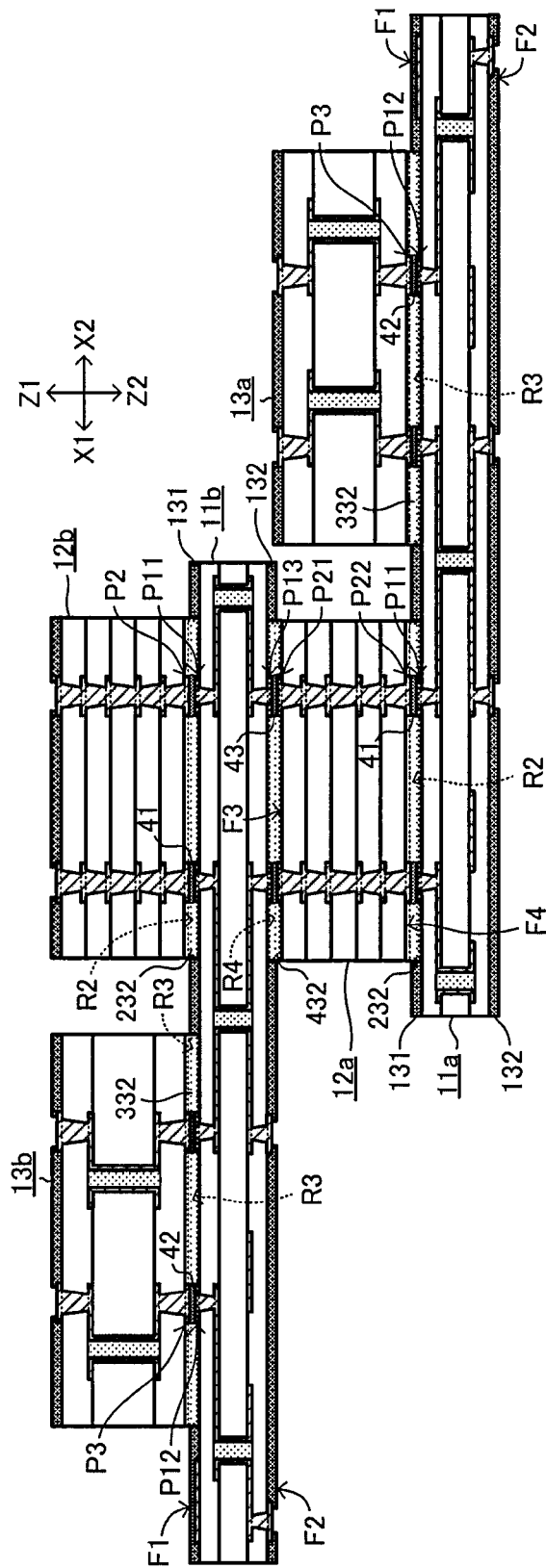
FIG. 16 is, in yet another embodiment of the present invention, a view showing an example where two pairs of wiring board groups are connected.

As shown in FIG. 16, two pairs of groups of wiring boards (a group of wiring boards (11a, 12a, 13a) and another group of wiring boards (11b, 12b, 13b)), which are structured substantially the same as a group of wiring boards (11, 12, 13) shown in FIG. 1, may be combined with each other.

In the example shown in FIG. 16, a group of wiring boards (11a, 12a, 13a) is structured the same as a group of wiring boards (11a, 12, 13) in the example shown in FIG. 14. In the following, structures of a group of wiring boards (11b, 12b, 13b) are described. Wiring board (11b) (fourth wiring board) has first surface (F1), second surface (F2) opposite first surface (F1), solder-resist layer 131 (first-surface side solder-resist layer) formed on first surface (F1), and solder-resist layer 132 (second-surface side solder-resist layer) formed on second surface (F2).

Opening portions (R2, R3) (each a first-surface side opening portion) are formed in solder-resist layer 131 of wiring board (11b), and wiring board (12b) positioned in opening portion (R2) and wiring board (13b) positioned in opening portion (R3) are each connected to first surface (F1) of wiring board (11b). In opening portion (R2), pad (P11) of wiring board (11b) and pad (P2) of wiring board (12b) are electrically connected through bonding layer 41, and adhesive layer 232 is formed around bonding layer 41. In opening portion (R3), pad (P12) of wiring board (11b) and pad (P3) of wiring board (13b) are electrically connected through bonding layer 42, and adhesive layer 332 is formed around bonding layer 42.

Wiring board (11a) (first wiring board) and wiring board (11b) (fourth wiring board) are connected to each other by wiring board (12a) (second wiring board). Specifically, opening portion (R2) is formed in solder-resist layer 131 of wiring board (11a), and one side of wiring board (12a) is positioned in opening portion (R2) of wiring board (11a). Then, in opening portion (R2), pad (P11) of wiring board (11a) and pad (P22) on the fourth-surface (F4) side of wiring board (12a) are electrically connected through bonding layer 41, and adhesive layer 232 is formed around bonding layer 41. Also, opening portion (R4) is formed in solder-resist layer 132 of wiring board (11b), and the other side of wiring board (12a) is positioned in opening portion (R4) of wiring board (11b). Then, in opening portion (R4), pad (P13) of wiring board (11b) and pad (P21) on the third-surface (F3) side of wiring board (12a) are electrically connected through bonding layer 43, and adhesive layer 432 is formed around bonding layer 43.

In the example shown in FIG. 16, wiring board (12a) is sandwiched by wiring boards (11a, 11b). In addition, wiring boards (12a, 12b) are stacked in direction Z.

Figure 17:
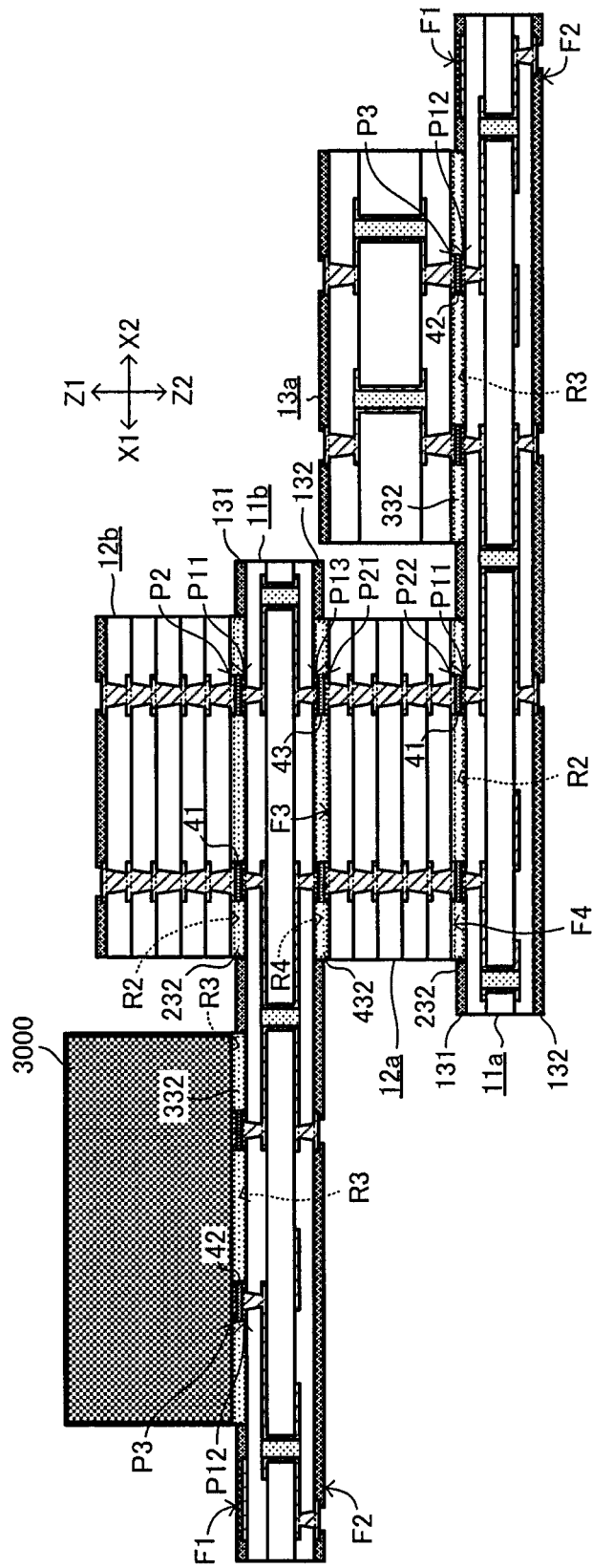
FIG. 17 is, regarding the example shown in FIG. 16, a view showing an alternative example where a wiring board is replaced with an electronic component, for example.

As shown in FIG. 17, wiring board (13b), for example, in the example shown in FIG. 16 may be replaced with electronic component 3000, which is then positioned in opening portion (R3) and connected to first surface (F1) of wiring board (11b).

In the example shown in FIG. 16, either wiring board (12b) or (13b) may be omitted. Also, in the example shown in FIG. 17, either electronic component 3000 or wiring board (12b) may be omitted.

Figure 18A:
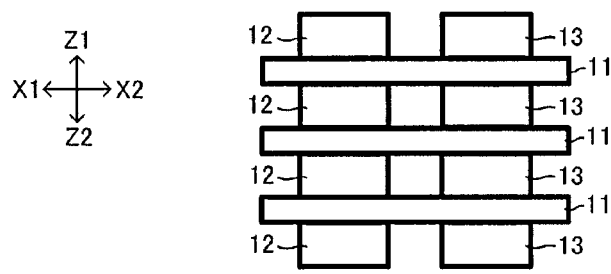
FIG. 18A is, in yet another embodiment of the present invention, a view showing an example where the structure shown in FIG. 1 is stacked.

As shown in FIG. 18A, a unit with the structure shown in FIG. 1 may be arrayed to be contiguous in direction Z. In such a case, wiring boards (12, 13) and wiring board 11 are alternately stacked in direction Z. Using such a structure, any number of wiring boards may be stacked in direction Z. In the example in FIG. 18A, four each of wiring boards (12, 13) are stacked in direction Z.

Figure 18B:
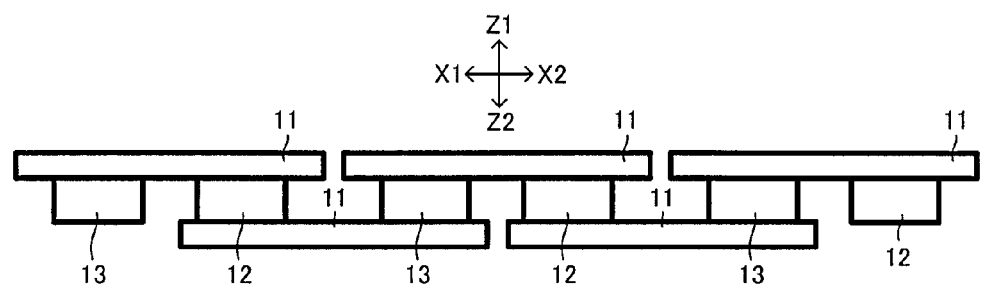
FIG. 18B is, in yet another embodiment of the present invention, a view showing an example where any selected number of wiring boards are connected while maintaining substantially a constant thickness.

As shown in FIG. 18B, a unit with the structure shown in FIG. 14 may be arrayed to further extend continuously in direction X (the direction in which wiring boards (12~14) are arranged). Any number of wiring boards may be connected while maintaining substantially the same thickness. In the example shown in FIG. 18B, three each of wiring boards (12, 13) are alternately connected by wiring boards 11. In addition to direction X, any number of wiring boards may also be connected in direction Y.

Figure 18C:
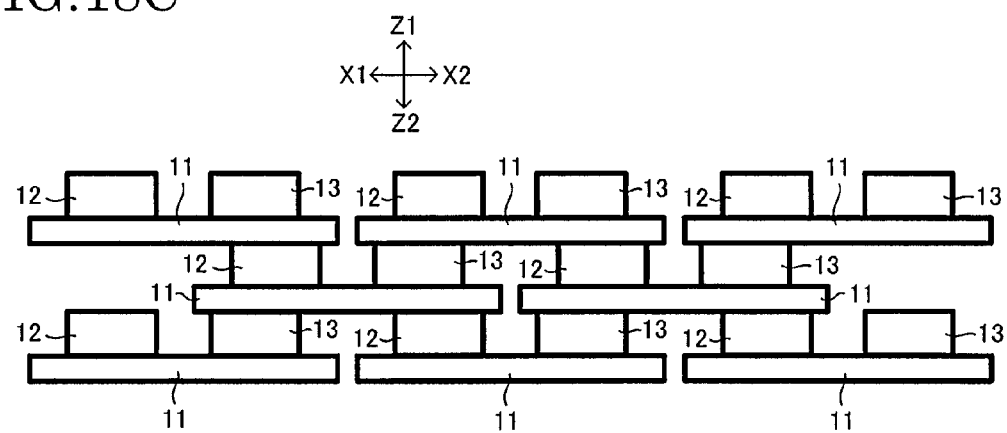
FIG. 18C is, in yet another embodiment of the present invention, a view showing an example where the structure shown in FIG. 1 is connected in multiple directions (direction X and direction Z)

As shown in FIG. 18C, a unit with the structure shown in FIG. 1 may be connected in direction Z, direction X or direction Y. Alternatively, the unit may be connected in all directions X, Y and Z.

In examples shown in FIGS. 18A~18C, only one type of unit is connected. However, units of multiple types may also be connected in substantially the same manner shown in FIGS. 18A~18C.

Figure 19:
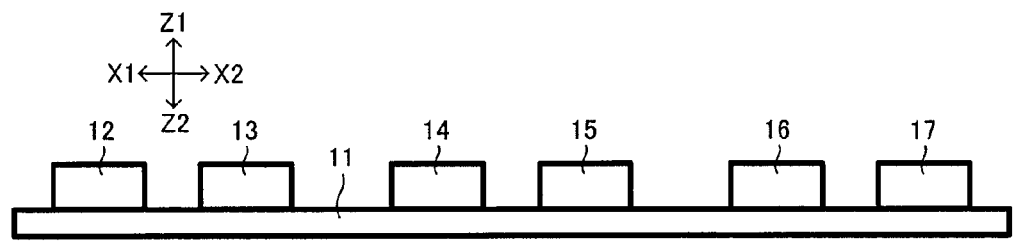
FIG. 19 is, in yet another embodiment of the present invention, a view showing an example where three or more wiring boards are mounted on a first wiring board.

As shown in FIG. 19, three or more wiring boards (wiring boards (12~17), for example) may be mounted on wiring board 11. Here, the method for mounting each wiring board is the same as in the above embodiment, for example. Wiring boards (12~17) have different numbers of conductive layers from each other, for example.

Figure 20A:
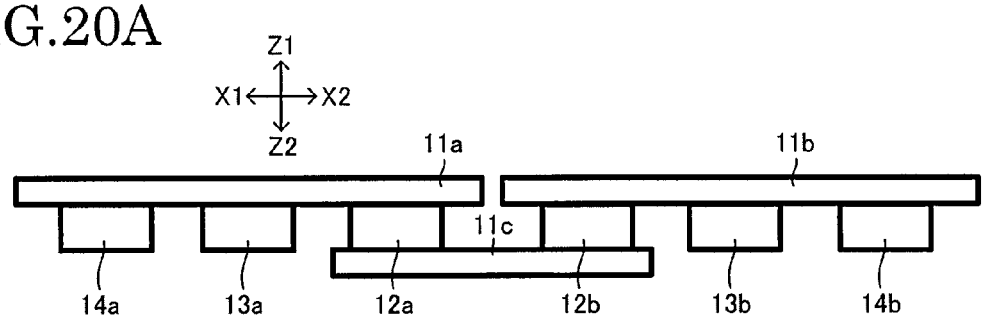
FIG. 20A is, in yet another embodiment of the present invention, a view showing an example where multiple first wiring boards with three or more mounted wiring boards are connected to each other by another first wiring board.
Figure 20B:
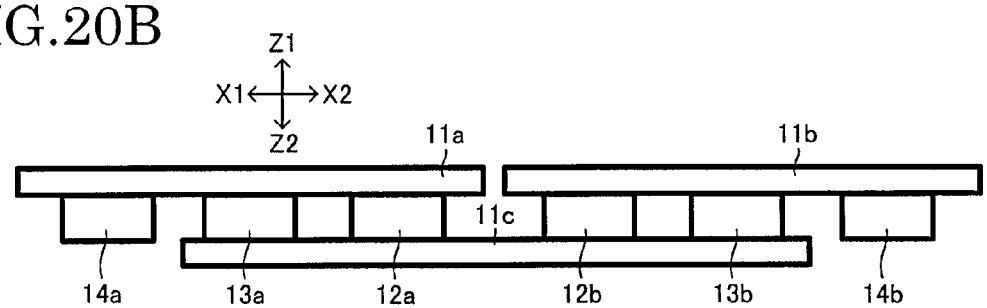
FIG. 20B is, in yet another embodiment of the present invention, a view showing an example where a first wiring board is connected differently from the example shown in FIG. 20A.
Figure 20C:
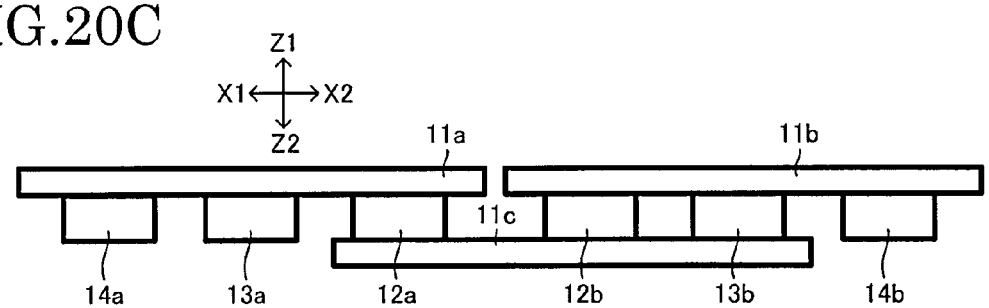
FIG. 20C is, in yet another embodiment of the present invention, a view showing an example where a first wiring board is connected differently from the examples shown in FIGS. 20A and 20B.

Any structure shown in FIGS. 12~18 may be applied to wiring board 11 where three or more wiring boards are mounted. For example, as shown in FIGS. 20A~20C, wiring board (11a) where wiring boards (12a, 13a, 14a) are mounted and wiring board (11b) where wiring boards (12b, 13b, 14b) are mounted may be connected to each other by wiring board (11c). Wiring boards (11a, 11b, 11c) each have substantially the same structure as wiring board 11 shown in FIG. 1, for example. In the example shown in FIG. 20A, wiring boards (12a, 12b) are mounted on and shared by wiring boards (11a, 11b) and wiring board (11c). In the example shown in FIG. 20B, wiring boards (12a, 13a, 12b, 13b) are mounted on and shared by wiring boards (11a, 11b) and wiring board (11c). In the example shown in FIG. 20C, wiring boards (12a, 12b, 13b) are mounted on and shared by wiring boards (11a, 11b) and wiring board (11c). As described, the number of wiring boards mounted on and shared by wiring board (11a) and wiring board (11c) may be the same as or different from the number of wiring boards mounted on and shared by wiring board (11b) and wiring board (11c).

The above embodiment shows an example in which wiring boards (11~13) are all rigid wiring boards. However, that is not the only option. For example, wiring board 11 (first wiring board) may be a flexible wiring board, while wiring board 12 (second wiring board) and wiring board 13 (third wiring board) are each a rigid wiring board. Especially, in a structure where any number of wiring boards are connected while maintaining substantially the same thickness as shown in FIG. 18B, for example, it is effective to set wiring board 11 as a flexible wiring board, since force to bend wiring board 11 tends to be exerted.

Figure 21:
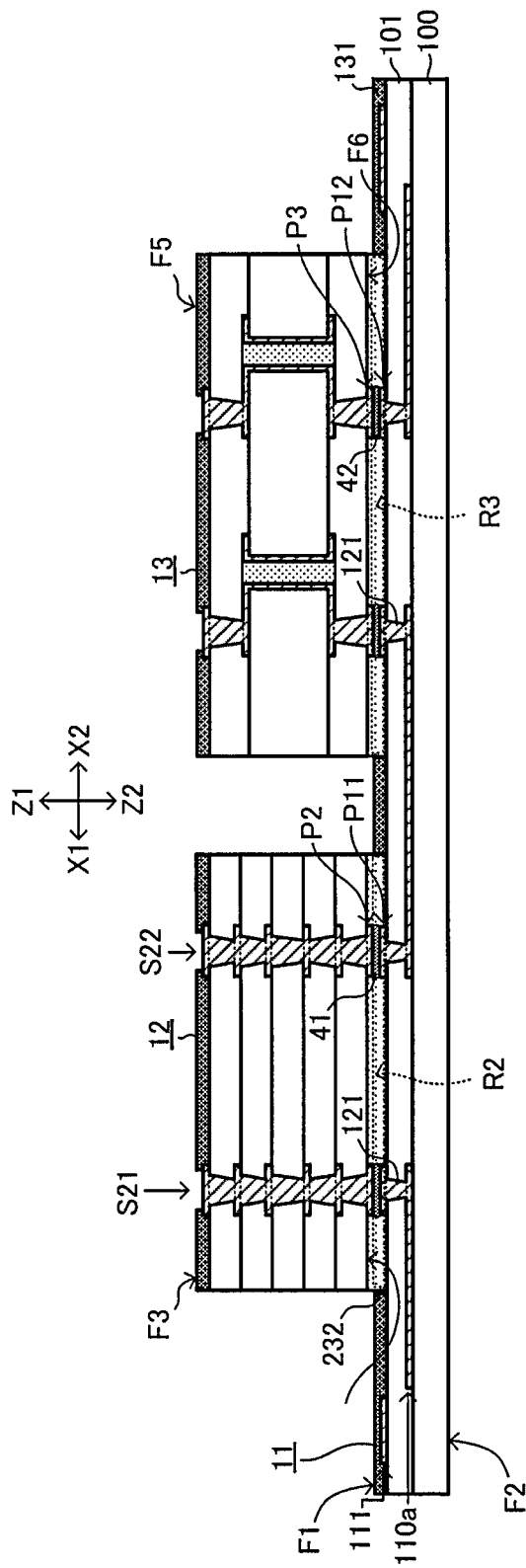
FIG. 21 is, in yet another embodiment of the present invention, a view showing an example where a conductive layer is formed only on one side of a core substrate.

In the above embodiment, wiring board 11 (first wiring board) is set as a double-sided wiring board having conductive layers on both sides of substrate 100 (core substrate). However, that is not the only option. For example, as shown in FIG. 21, it may be a single-sided wiring board having a conductive layer only on one side of substrate 100 (core substrate).

In the above embodiment, the number of conductive layers in wiring board 13 is the same as the number of conductive layers in wiring board 11. However, as shown in FIG. 21, the number of conductive layers may decrease from wiring board 12 to wiring board 13 to wiring board 11 in that order.

Figure 22:
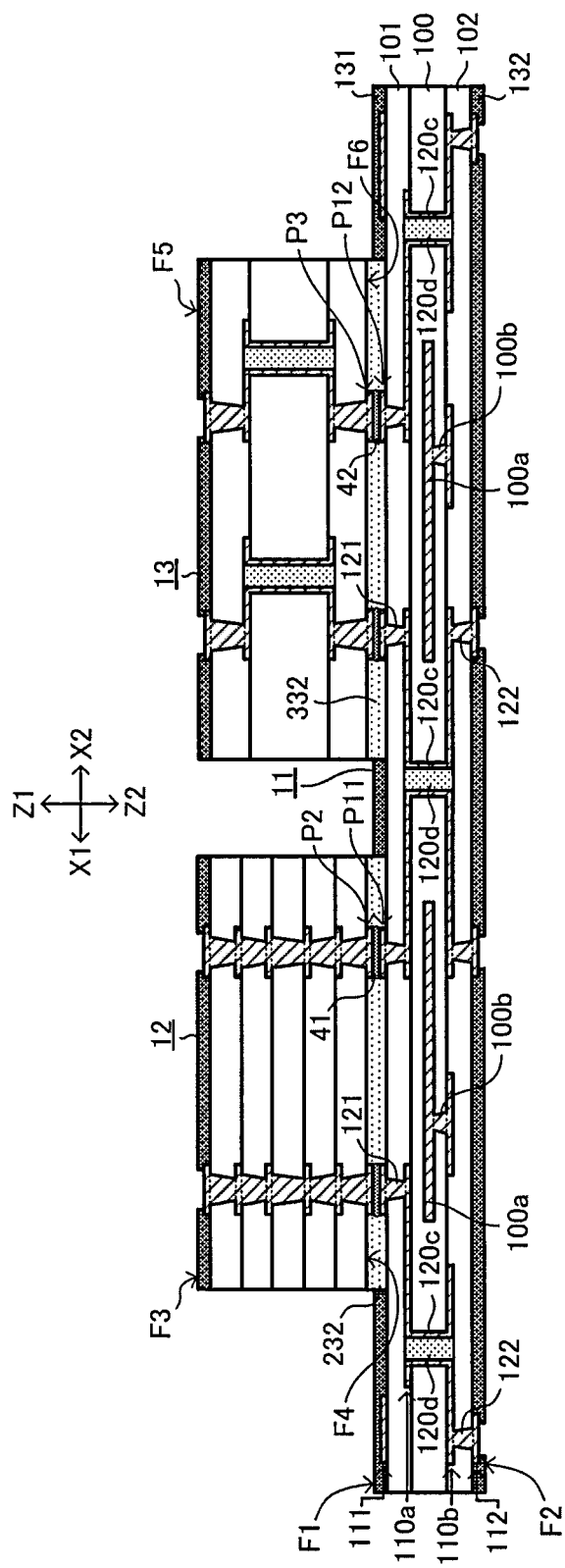
FIG. 22 is, in yet another embodiment of the present invention, a view showing an example where a metal sheet is built in a first wiring board.

As shown in FIG. 22, substrate 100 (core substrate) of wiring board 11 (first wiring board) may have a built-in metal sheet (100*a*) (such as copper foil). Heat dissipation is enhanced in substrate 100 because of metal sheet (100*a*). In the example in FIG. 22, via conductor (100*b*) reaching metal sheet (100*a*) is formed in substrate 100, and metal sheet (100*a*) and a ground line (a conductive pattern included in conductive layer (110*b*)) are electrically connected to each other by via conductor (100*b*). The planar shape of metal sheet (100*a*) is determined freely. It may be rectangular, for example, or circular, for example.

Figure 23:
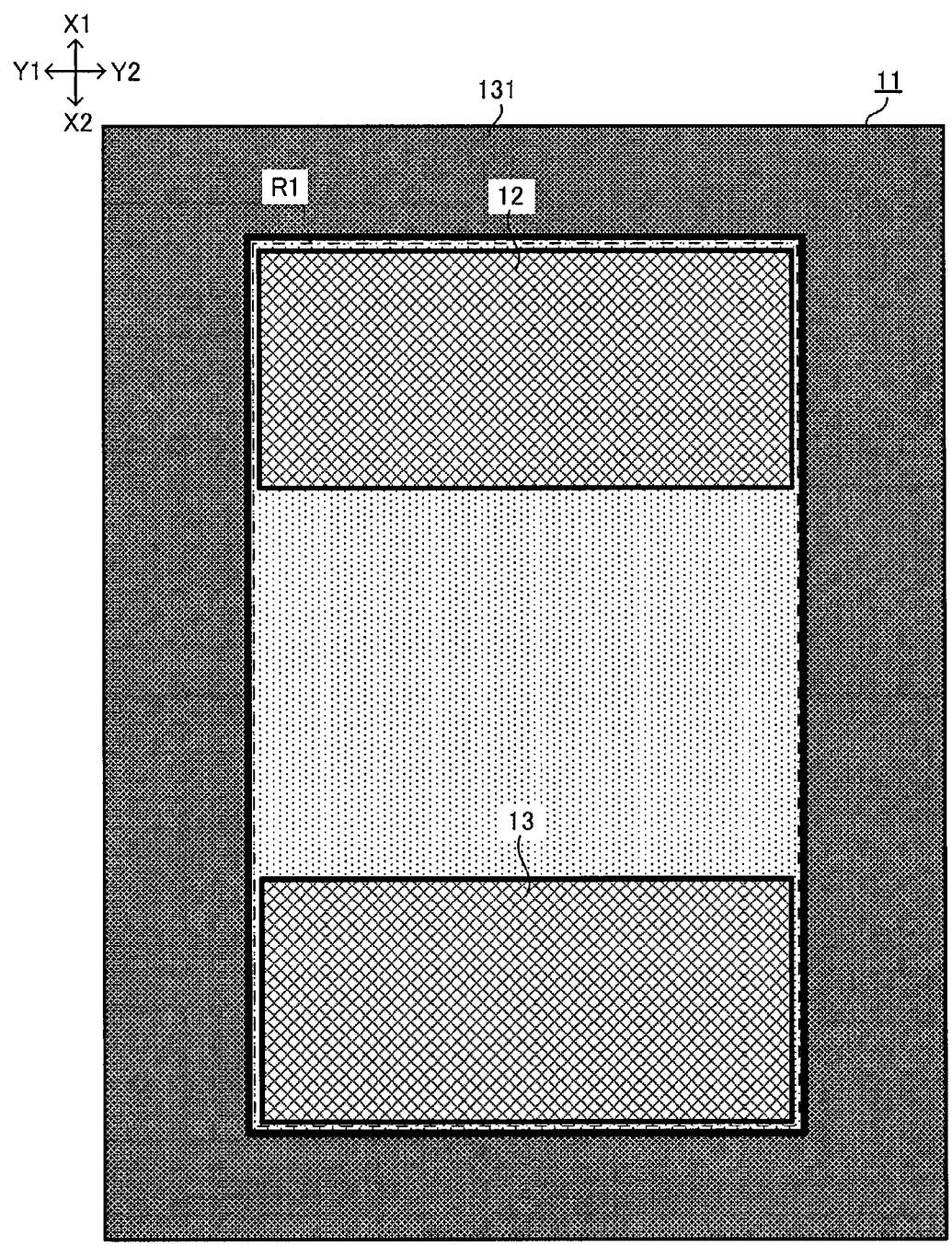
FIG. 23 is, in yet another embodiment of the present invention, a view showing an example where a second wiring board and a third wiring board are positioned in a common opening portion and are each connected to a first wiring board.

As shown in FIG. 23, it is an option for wiring board 12 (second wiring board) and wiring board 13 (third wiring board) to be positioned in the same opening portion (R1) (first-surface side opening portion) and for each to be connected to wiring board 11 (first wiring board).

Figure 24:
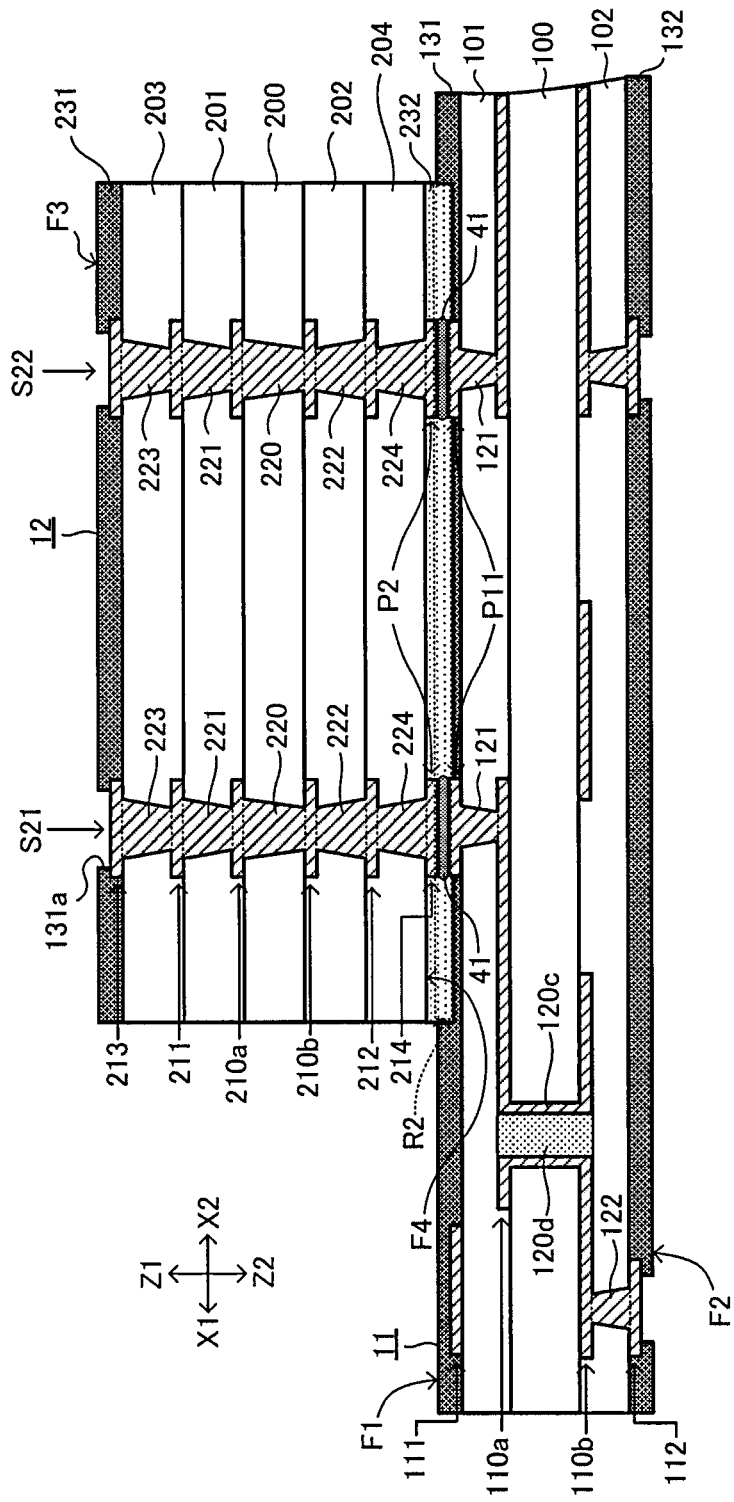
FIG. 24 is, in yet another embodiment of the present invention, a view showing an example where the depth of opening portions in a solder-resist layer to position a second wiring board and a third wiring board is less than the thickness of the solder-resist layer.

As shown in FIG. 24, the depth of opening portion (R2) (first-surface side opening portion) may be less than the thickness of solder-resist layer 131 (first-surface side solder-resist layer). Although not shown in the drawing, the depth of opening portion (R3) (first-surface side opening portion) may also be less than the thickness of solder-resist layer 131 (first-surface side solder-resist layer).

Figure 25:
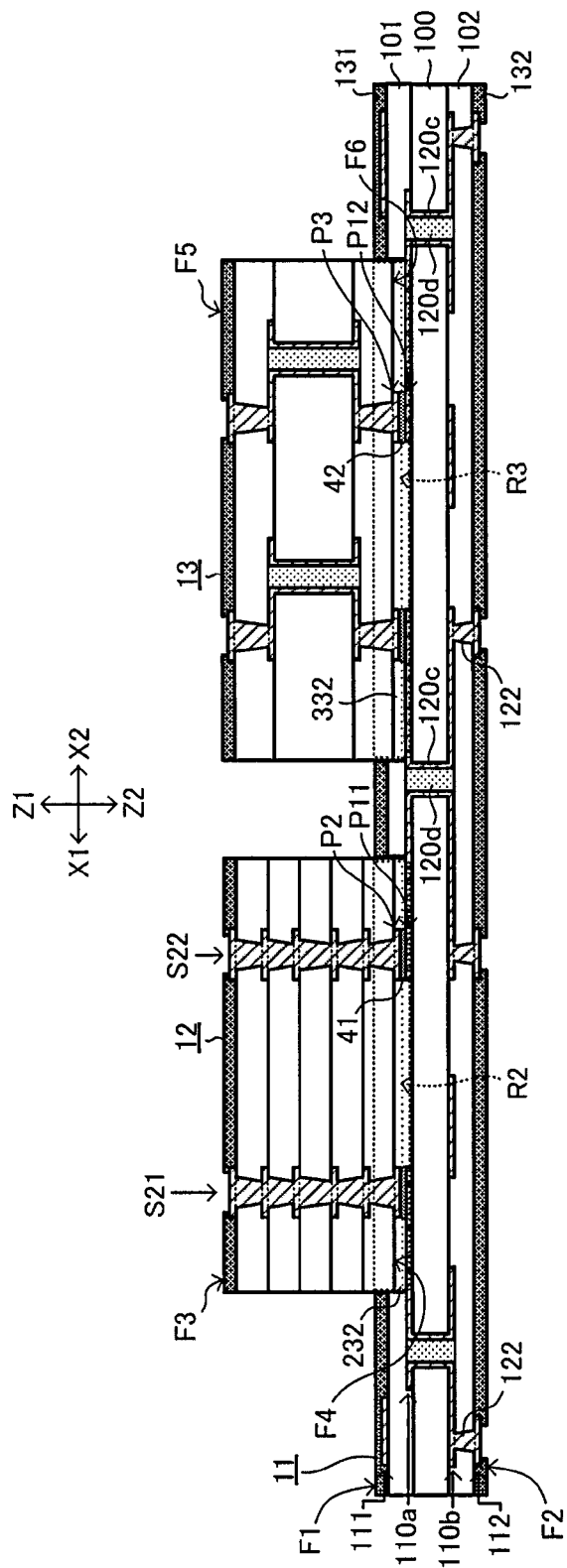
FIG. 25 is, in yet another embodiment of the present invention, a view showing an example where an opening portion in a solder-resist layer to position a second wiring board and a third wiring board reaches an inner conductive layer of a first wiring board, and the thicknesses of the second wiring board and the third wiring board are each greater than the depth of the opening portion.

As shown in FIG. 25, opening portions (R2, R3) (each a first-surface side opening portion) may each reach inner conductive layer (110*a*) of wiring board 11 (first wiring board), the thickness of wiring board 12 (second wiring board) may be greater than the depth of opening portion (R2), and the thickness of wiring board 13 (third wiring board) may also be greater than the depth of opening portion (R3).

Figure 26A:
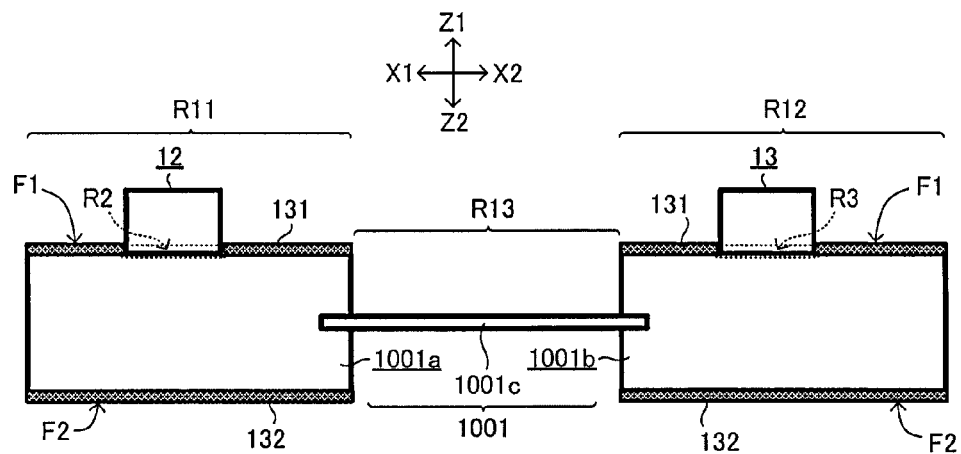
FIG. 26A is, in yet another embodiment of the present invention, a view showing a first example where a second wiring board and a third wiring board are connected to a flex-rigid wiring board.
Figure 26B:
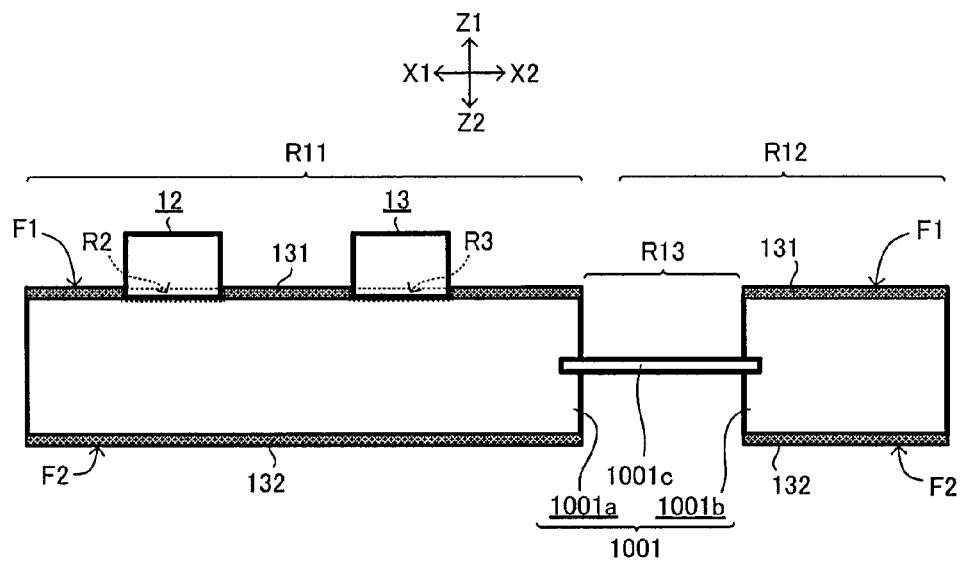
FIG. 26B is, in yet another embodiment of the present invention, a view showing a second example where a second wiring board and a third wiring board are connected to a flex-rigid wiring board.

As shown in FIGS. 26A and 26B, wiring board 12 (second wiring board) and wiring board 13 (third wiring board) may be connected to flex-rigid wiring board 1001. In such a case, flex-rigid wiring board 1001 corresponds to a first wiring board. Flex-rigid wiring board 1001 is formed by connecting rigid wiring board (1001*a*) (first rigid wiring board) and rigid wiring board (1001*b*) (second rigid wiring board) by flexible wiring board (1001*c*). Then, rigid sections (R11, R12) are respectively formed by rigid wiring boards (1001*a*, 1001*b*), and flexible section (R13) is formed between rigid section (R11) and rigid section (R12) by flexible wiring board (1001*c*).

In the example shown in FIG. 26A, wiring board 12 is positioned in opening portion (R2) (first-surface side opening portion) formed in solder-resist layer 131 (first-surface side solder-resist layer) in rigid wiring board (1001*a*), while wiring board 13 is positioned in opening portion (R3) (first-surface side opening portion) formed in solder-resist layer 131 (first-surface side solder-resist layer) in rigid wiring board (1001*b*). Wiring board 12 is connected to rigid wiring board (1001*a*) in opening portion (R2), and wiring board 13 is connected to rigid wiring board (1001*b*) in opening portion (R3). The connected portion of wiring board 12 and rigid wiring board (1001*a*) has a structure the same as that shown in FIG. 3, for example, and the connected portion of wiring board 13 and rigid wiring board (1001*b*) has a structure the same as that shown in FIG. 4, for example.

In the example shown in FIG. 26B, wiring boards (12, 13) are positioned respectively in opening portions (R2, R3) (first-surface side opening portions) formed in solder-resist layer 131 (first-surface side solder-resist layer) in rigid wiring board (1001*a*). Wiring board 12 is connected to rigid wiring board (1001*a*) in opening portion (R2), while wiring board 13 is connected to rigid wiring board (1001*a*) in opening portion (R3). The connected portion of wiring board 12 and rigid wiring board (1001*a*) has a structure the same as that shown in FIG. 3, for example, and the connected portion of wiring board 13 and rigid wiring board (1001*a*) has a structure the same as that shown in FIG. 4, for example.

Regarding other features, structures of wiring boards (11~17, 11*a*, 11*b*, 11*c*, 12*a*, 13*a*, 14*a*, 12*b*, 13*b*, 14*b*), as well as type, performance, measurements, quality, shapes, number of layers, positioning and so forth of the elements of such structures, may be modified freely within a scope that does not deviate from the gist of the present invention.

For example, an electronic component may be surface mounted on each of wiring boards (11~13) shown in FIG. 1. Alternatively, wiring boards (11~13) may each have a built-in electronic component. Yet alternatively, it is an option for wiring board 12 not to include a stacked-conductor structure.

The contents and the order in the manufacturing method according to the above embodiment may be modified freely within a scope that does not deviate from the gist of the present invention. Also, some process may be omitted depending on usage requirements or the like.

The above embodiment and modified examples or the like may be combined. For example, any wiring board shown in FIGS. 11~20C may be applied to any structure shown in FIGS. 22~25.

A wiring board according to an embodiment of the present invention has a first wiring board having a first surface, a second surface opposite the first surface and a first-surface side solder-resist layer formed on the first surface, and a second wiring board and a third wiring board connected to the first surface of the first wiring board. In such a wiring board, one or multiple first-surface side opening portions are formed in the first-surface side solder-resist layer, and the second wiring board and the third wiring board are positioned in a common first-surface side opening portion or in separate first-surface side opening portions, and are each connected to the first wiring board.

A method for manufacturing a wiring board according to another embodiment of the present invention includes the following: preparing a first wiring board having a first surface, a second surface opposite the first surface, and a first-surface side solder-resist layer formed on the first surface and having one or multiple first-surface side opening portions; preparing a second wiring board and a third wiring board; and positioning the second wiring board and the third wiring board either in a common first-surface side opening portion or in separate first-surface side opening portions, and connecting each wiring board to the first surface of the first wiring board.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
a first multilayer wiring board comprising a first solder-resist layer;
a second multilayer wiring board connected to the first multilayer wiring board and positioned in a first opening portion formed in the first solder-resist layer of the first multilayer wiring board; and
a third multilayer wiring board connected to the first multilayer wiring board and positioned in a second opening portion formed in the first solder-resist layer of the first multilayer wiring board such that the second multilayer wiring board and the third multilayer wiring board are on a same side of the first multilayer wiring board,
wherein the first opening portion of the first multilayer wiring board has an opening area which is greater than a bottom surface area of the second multilayer wiring board facing the first opening portion, and the second opening portion of the first multilayer wiring board has an opening area which is greater than a bottom surface area of the third multilayer wiring board facing the second opening portion.

2. The wiring board according to claim 1, wherein the second multilayer wiring board has a plurality of conductive layers which has a different number of layers from a plurality of conductive layers in the third multilayer wiring board.

3. The wiring board according to claim 1, wherein the second multilayer wiring board has a pad electrically connected to a pad of the first multilayer wiring board in the first opening portion of the first multilayer wiring board, and the third multilayer wiring board has a pad electrically connected to a pad of the first multilayer wiring board in the second opening portion of the first multilayer wiring board.

4. The wiring board according to claim 3, further comprising:
a first adhesive layer formed between the first multilayer wiring board and the second multilayer wiring board; and
a second adhesive layer formed between the first multilayer wiring board and the third multilayer wiring board.

5. The wiring board according to claim 4, wherein the second multilayer wiring board has a pad electrically connected to a pad of the first multilayer wiring board through a first conductive solder in the first opening portion of the first multilayer wiring board, the first adhesive layer is formed around the first conductive solder, the third multilayer wiring board has a pad electrically connected to a pad of the first multilayer wiring board through a second conductive solder in the second opening portion of the first multilayer wiring board, and the second adhesive layer is formed around the second conductive solder.

6. The wiring board according to claim 1, wherein the first opening portion of the first multilayer wiring board has a depth which is a same as or less than a thickness of the first solder-resist layer, and the second opening portion of the first multilayer wiring board has a depth which is a same as or less than the thickness of the first solder-resist layer.

7. The wiring board according to claim 1, wherein the first opening portion of the first multilayer wiring board penetrates at least through the first solder-resist layer, and the second opening portion of the first multilayer wiring board penetrates at least through the first solder-resist layer.

8. The wiring board according to claim 7, wherein the first and second opening portions of the first multilayer wiring board reach an inner conductive layer of the first multilayer wiring board, and the second multilayer wiring board and the third multilayer wiring board have thicknesses which are greater than a depth of the first and second opening portions.

9. The wiring board according to claim 1, wherein the first opening portion of the first multilayer wiring board and the second opening portion of the first multilayer wiring board form a plurality of separate opening portions separately accommodating the second wiring board and the third multilayer wiring board in the first solder-resist layer.

10. The wiring board according to claim 1, wherein the first opening portion of the first multilayer wiring board and the second opening portion of the first multilayer wiring board form a common opening portion accommodating the second multilayer wiring board and the third multilayer wiring board in the first solder-resist layer.

11. The wiring board according to claim 1, wherein the first multilayer wiring board is a rigid wiring board, the second multilayer wiring board is a rigid wiring board, and the third multilayer wiring board is a rigid wiring board.

12. The wiring board according to claim 1, wherein the first multilayer wiring board is a flex-rigid wiring board comprising a plurality of rigid wiring boards and a flexible wiring board connecting the rigid wiring boards, and the second multilayer wiring board and the third multilayer wiring board are positioned on the rigid wiring boards, respectively.

13. The wiring board according to claim 1, wherein the first multilayer wiring board is a flex-rigid wiring board comprising a first rigid wiring board, a second rigid wiring board and a flexible wiring board connecting the first rigid wiring board and the second rigid wiring board, the second multilayer wiring board is positioned in the first opening portion formed in the first rigid wiring board, and the third multilayer wiring board is positioned in the second opening portion formed in the second rigid wiring board.

14. The wiring board according to claim 1, wherein the first multilayer wiring board is a flexible wiring board, the second multilayer wiring board is a rigid wiring board, and the third multilayer wiring board is a rigid wiring board.

15. The wiring board according to claim 1, wherein the second multilayer wiring board and the third multilayer wiring board are positioned on the first multilayer wiring board such that the second multilayer wiring board and the third multilayer wiring board have surfaces substantially on a same level on an opposite side of the first multilayer wiring board in a thickness direction of the second multilayer wiring board and the third multilayer wiring board.

16. The wiring board according to claim 1, wherein the second multilayer wiring board has a greater number of conductive layers than the third multilayer wiring board and has a plurality of interlayer insulation layers and a plurality of filled conductors through the interlayer insulation layers between the conductive layers.

17. The wiring board according to claim 1, wherein the first multilayer wiring board has the lowest number of conductive layers among the first multilayer wiring board, the second multilayer wiring board and the third multilayer wiring board.

18. The wiring board according to claim 1, wherein the first multilayer wiring board has the least thickness among the first multilayer wiring board, the second multilayer wiring board and the third multilayer wiring board.

19. The wiring board according to claim 1, wherein the first multilayer wiring board has a built-in metal sheet.

20. The wiring board according to claim 1, further comprising one of a fourth wiring board and an electronic component connected to the first multilayer wiring board, wherein the first multilayer wiring board has a second solder-resist layer formed on an opposite side of the first solder-resist layer, the first multilayer wiring board has a third opening portion formed in the second solder-resist layer, and the one of the fourth wiring board and the electronic component is positioned in the third opening portion of the first multilayer wiring board.

21. The wiring board according to claim 1, further comprising a fourth wiring board comprising a solder-resist layer, wherein the fourth wiring board has an opening portion formed in the solder-resist layer of the fourth wiring board, and at least one of the second multilayer wiring board and the third multilayer wiring board is connected to the fourth wiring board through the opening portion of the fourth wiring board.

22. The wiring board according to claim 1, further comprising:
   a fourth wiring board comprising a first solder-resist layer formed on a first surface of the fourth wiring board and a second solder-resist layer formed on a second surface of the fourth wiring board; and
   one of a fifth wiring board and an electronic component connected to the fourth wiring board,
   wherein the fourth wiring board has a first opening portion formed in the first solder-resist layer of the fourth wiring board and a second opening portion formed in the second solder-resist layer of the fourth wiring board, the one of the fifth wiring board and the electronic component is positioned in the first opening portion of the fourth wiring board, and at least one of the second multilayer wiring board and the third multilayer wiring board is connected to the fourth wiring board through the second opening portion of the fourth wiring board.

23. A method for manufacturing a wiring board, comprising:
   preparing a first multilayer wiring board comprising a first solder-resist layer;
   forming a first opening portion in the first solder-resist layer of the first multilayer wiring board;
   forming a second opening portion in the first solder-resist layer of the first multilayer wiring board;
   positioning a second multilayer wiring board in the first opening portion in the first solder-resist layer of the first multilayer wiring board such that the second multilayer wiring board is connected to the first multilayer wiring board; and
   positioning a third multilayer wiring board in the second opening portion in the first solder-resist layer of the first multilayer wiring board such that the third multilayer wiring board is connected to the first multilayer wiring board and the second multilayer wiring board and the third multilayer wiring board are on a same side of the first multilayer wiring board,
   wherein the first opening portion of the first multilayer wiring board has an opening area which is greater than a bottom surface area of the second multilayer wiring board facing the first opening portion, and the second opening portion of the first multilayer wiring board has an opening area which is greater than a bottom surface area of the second multilayer wiring board facing the first opening portion.

24. The method for manufacturing a wiring board according to claim 23, wherein the second multilayer wiring board has a plurality of conductive layers which has a different number of layers from a plurality of conductive layers in the third multilayer wiring board.

25. The method for manufacturing a wiring board according to claim 23, wherein the positioning of the second multilayer wiring board comprises connecting a pad of the second multilayer wiring board to a pad of the first multilayer wiring board in the first opening portion, and the positioning of the third multilayer wiring board comprises connecting a pad of the third multilayer wiring board to a pad of the first multilayer wiring board in the second opening portion.

26. The method for manufacturing a wiring board according to claim 23, wherein the positioning of the second multilayer wiring board comprises connecting a pad of the second wiring board to a pad of the first multilayer wiring board in the first opening portion through a first conductive boding layer, and the positioning of the third multilayer wiring board comprises connecting a pad of the third wiring board to a pad of the first multilayer wiring board in the second opening portion through a second conductive boding layer.

27. The method for manufacturing a wiring board according to claim 26, wherein the first bonding layer is made of a metallic material having a fusing point of 200~250° C., and the second bonding layer is made of a metallic material having a fusing point of 200~250° C.

* * * * *